(12) United States Patent
Kwon et al.

(10) Patent No.: US 7,459,774 B2
(45) Date of Patent: Dec. 2, 2008

(54) STACKED CHIP PACKAGE USING PHOTOSENSITIVE POLYMER AND MANUFACTURING METHOD THEREOF

(75) Inventors: Yong-Chai Kwon, Suwon (KR); Kang-Wook Lee, Suwon (KR); Keum-Hee Ma, Andong (KR); Seong-Il Han, Suwon (KR)

(73) Assignee: Samsung Electronics Co., Ltd. (KR)

( * ) Notice: Subject to any disclaimer, the term of this patent is extended or adjusted under 35 U.S.C. 154(b) by 223 days.

(21) Appl. No.: 11/436,851

(22) Filed: May 18, 2006

(65) Prior Publication Data

US 2007/0048969 A1 Mar. 1, 2007

(30) Foreign Application Priority Data

Aug. 31, 2005 (KR) .................. 10-2005-0080655

(51) Int. Cl.
*H01L 23/02* (2006.01)
(52) U.S. Cl. ............... 257/686; 257/777; 257/E25.006; 257/E25.013; 257/E25.018; 257/E25.021; 257/E25.027; 257/E25.085
(58) Field of Classification Search ............... 257/686, 257/777, E25.006, E25.013, E25.018, E25.021, 257/E25.027, E23.085, E21.614; 438/109, 438/FOR. 386, FOR. 426
See application file for complete search history.

(56) References Cited

U.S. PATENT DOCUMENTS 6,429,096 B1 8/2002 Yanagida .................. 438/459

2003/0107119 A1* 6/2003 Kim ........................ 257/686
2003/0127724 A1* 7/2003 Senba ...................... 257/698
2004/0238927 A1 12/2004 Miyazawa ................ 257/678

FOREIGN PATENT DOCUMENTS

| JP | 2002-050738 | 2/2002 |
| JP | 2004-288722 | 10/2004 |
| KR | 10-2002-0012061 | 2/2002 |
| KR | 10-2006-0010099 | 2/2006 |

* cited by examiner

*Primary Examiner*—Jasmine J Clark
(74) *Attorney, Agent, or Firm*—Mills & Onello LLP

(57) ABSTRACT

In a stacked chip configuration, and manufacturing methods thereof, the gap between a lower and an upper chip is filled completely using a relatively simple process that eliminates voids between the lower and upper chips and the cracking and delamination problems associated with such voids. The present invention is applicable to both chip-level bonding and wafer-level bonding approaches. A photosensitive polymer layer is applied to a first chip, or wafer, prior to stacking the chips or stacking the wafers. The photosensitive polymer layer is partially cured, so that the photosensitive polymer layer is made to be structurally stable, while retaining its adhesive properties. The second chip, or wafer, is stacked, aligned, and bonded to the first chip, or wafer, and the photosensitive polymer layer is then cured to fully bond the first and second chips, or wafers. In this manner, adhesion between chips/wafers is greatly improved, while providing complete gap fill. In addition, mechanical reliability is improved, alleviating the problems associated with cracking and delamination, and leading to an improvement in device yield and device reliability.

13 Claims, 23 Drawing Sheets

STACKED CHIP PACKAGE USING PHOTOSENSITIVE POLYMER AND MANUFACTURING METHOD THEREOF

RELATED APPLICATIONS

This application claims priority under 35 U.S.C. 119 to Korean Patent Application No. 10-2005-0080655 filed on Aug. 31, 2005, the content of which is incorporated herein by reference in its entirety. This application is related to U.S. patent application Ser. No. 11/436,822, entitled "Stacked Chip Package Using Warp Buffer Insulative Material and Manufacturing Method Thereof", by Yong-Chai Kwon, et al., filed of even date herewith and commonly owned with the present application, the content of which is incorporated herein by reference in its entirety.

FIELD OF THE INVENTION

The present invention relates to semiconductor device packages including a stacked chip package configuration that utilizes a photosensitive polymer, and manufacturing methods thereof.

BACKGROUND OF THE INVENTION

Semiconductor manufacturing and packaging technology has evolved to the point where device packages can include multiple integrated circuit chips that are bonded together in a stacked, three-dimensional relationship. Such packages provide a smaller form factor and higher integration density at the package level. The chip stack configuration is amenable to high-speed operation, higher fan-out of signals, reduced noise levels for signal transmission between chips, low power operation, and enhanced functionality within a single package.

Three-dimensional bonding technology continues to progress. In a package level bonding configuration, devices are formed on a semiconductor wafer, and diced into chips. The individual chips are packaged in separate packages, and the packages are stacked and bonded together to form a multiple stack package (MSP). The resulting MSPs enjoyed widespread use in the past, but are relatively bulky and cumbersome for modem applications.

In a chip level bonding configuration, devices are formed on a semiconductor wafer, and diced into chips. The individual chips are stacked and bonded, and the chip stack is packaged within a single, common, package to form a multiple chip package (MCP) or a three-dimensional chip stack package (CSP). The resulting MCPs have characteristically high yield, however, process throughput is a problem, as each individual chip needs to be handled during alignment and bonding processes.

Recently, wafer level bonding configurations have become popular. In a wafer level bonding configuration, devices are formed on a semiconductor wafer, and multiple wafers are stacked so that their corresponding chips are aligned. The wafer stack is bonded together, and then diced into chip stacks. The chip stacks are each packaged within a single, common, package to form a wafer-level three-dimensional chip stack package (WL CSP). The resulting WL CSPs suffer from low yield. However, process throughput is high, as handling of each individual chip is not required, since the chips are stacked at the wafer level.

Chip level bonding and wafer level bonding are generally complicated and unstable manufacturing processes. In such bonding approaches, the individual chips transfer signals to each other in a vertical direction using inter-chip, vertical vias. The inter-chip vias pass through the respective chip substrates, and include a landing pad feature at a top portion thereof and a bump feature at a bottom portion thereof. When a bump of one chip is bonded with a pad of another chip according to the conventional approach, electrical bonding of the bump and pad first takes place for example using a thermo-compression process at a temperature at least equal to the bonding eutectic point of the metals employed at the junction, and is followed by an underfill injection process for filling the gap between the chip substrates to secure mechanical bonding. The underfill process is unreliable, since the gap between the lower and upper chip substrates is small, for example on the order of 20 μm. If the underfill process does not result in a complete and uniform fill of the gap, then any resulting voids can increase the likelihood of future generation of cracks. Such cracks can propagate during future heating and cooling cycles, decreasing the reliability of the resulting chip stack device.

In addition, mechanical stress can develop between layers of a chip or between-adjacent chips of a package. Such stress is typically caused by a mismatch in coefficient of thermal expansion (CTE) between two adjacent layers. In the above chip stack configuration, the chip substrate, the metal of the landing pad, and the bonding material all have different CTE values. Such CTE mismatch can cause further cracking and delamination when subjected to numerous heating and cooling thermal cycles, negatively affecting device yield during manufacture, and device reliability during operation.

SUMMARY OF THE INVENTION

The present invention is directed to semiconductor device packages including a stacked chip stack configuration that utilizes a photosensitive polymer, and manufacturing methods thereof.

The present invention provides for a stacked chip package configuration, and manufacturing methods thereof, wherein the gap between a lower and an upper chip is filled completely using a relatively simple process that eliminates voids, and the cracking and delamination problems associated with such voids. The present invention is applicable to both chip-level bonding and wafer-level bonding approaches. A photosensitive polymer layer is applied to a first chip, or wafer, prior to stacking the chips or stacking the wafers. The photosensitive polymer layer is partially cured, so that the photosensitive polymer layer is made to be structurally stable, while retaining its adhesive properties. The second chip, or wafer, is stacked, aligned, and bonded to the first chip, or wafer, and the photosensitive polymer layer is then cured to fully bond the first and second chips, or wafers. In this manner, adhesion between chips/wafers is greatly improved, while providing complete fill of the gap. In addition, mechanical reliability is improved, alleviating the problems associated with cracking and delamination. This leads to an improvement in device yield and device reliability.

In one aspect, the present invention is directed to a method of manufacturing a semiconductor device. The method comprises: forming a first semiconductor device on a first substrate, the first semiconductor device including a first bonding pad on a first surface of the first substrate in a device region of the first semiconductor device; forming a first interconnect on the first surface of the first substrate, the first interconnect electrically coupled to the first bonding pad, and forming a conductive via through the first substrate, the conductive via being electrically coupled to the first interconnect and extending through a second surface of the first substrate opposite the first surface; forming a second semiconductor device on a second substrate, the second semiconductor device including a second bonding pad on a first surface of the second substrate in a device region of the second semiconductor device; forming a second interconnect on the first surface of the second substrate, the second interconnect electrically coupled to the second bonding pad; providing a photosensitive polymer layer on the first surface of the second substrate and on the second interconnect, at least a portion of the second interconnect being exposed through the photosensitive polymer layer; and applying the first surface of the second substrate including the photosensitive polymer layer to the second surface of the first substrate and aligning the conductive via of the first substrate with the exposed portion of the second interconnect to electrically couple the first bonding pad to the second bonding pad.

In one embodiment, providing the photosensitive polymer layer further comprises patterning the photosensitive polymer layer to expose the portion of the second interconnect.

In another embodiment, the first interconnect extends across the first surface of the first substrate in a direction toward an outer edge of the first substrate and the second interconnect extends across the first surface of the second substrate in a direction toward an outer edge of the second substrate.

In another embodiment, the conductive via is formed in a scribe lane region of the first semiconductor device. In another embodiment, the conductive via is formed in a device region of the first semiconductor device.

In another embodiment, the method further comprises partially curing the photosensitive polymer layer prior to applying and aligning the second substrate to the first substrate.

In another embodiment, the method further comprises curing the photosensitive polymer layer following applying and aligning the second substrate to the first substrate.

In another embodiment, the method further comprises applying a conductive layer to an upper surface of the second interconnect.

In another embodiment, forming a conductive via through the first substrate comprises: forming a via hole in the first substrate that extends through the first surface of the first substrate and partially into the first substrate; providing an insulating layer that lines sidewalls of the via hole; filling the via hole with conductive material to form the conductive via; and removing substrate material from the second surface of the first substrate to expose a lower end of the conductive via.

In another embodiment, removing the substrate material comprises: grinding the second surface of the first substrate to remove substrate material; and etching the second surface of the first substrate and a portion of the insulating layer to expose the lower end of the conductive via and a lower portion of sidewalls of the lower end of the conductive via.

In another embodiment, the first semiconductor device on the first substrate and the second semiconductor device on the second substrate are formed on a common semiconductor wafer.

In another embodiment, the first semiconductor device on the first substrate and the second semiconductor device on the second substrate are formed on separate first and second semiconductor wafers.

In another embodiment, the photosensitive polymer layer comprises a first photosensitive polymer layer and the method further comprises: providing a second photosensitive polymer layer on the first surface of the first substrate and on the first interconnect, at least a portion of the first interconnect being exposed through the second photosensitive polymer layer; forming a third substrate including a third bonding pad on a first surface of the third substrate; and applying the first surface of the first substrate including the second photosensitive polymer layer to the first surface of the third substrate and aligning the third bonding pad of the third substrate with the exposed portion of the first interconnect to electrically couple the third bonding pad to the first bonding pad.

In another embodiment, providing the second photosensitive polymer layer further comprises patterning the second photosensitive polymer layer to expose the portion of the first interconnect.

In another embodiment, the third substrate comprises a substrate selected from the group consisting of: printed circuit board (PCB), semiconductor device substrate, and package interposer.

In another embodiment, the method further comprises: partially curing the first photosensitive polymer layer prior to applying and aligning the second substrate to the first substrate; partially curing the second photosensitive polymer layer prior to applying and aligning the first substrate to the third substrate; and curing the first and second photosensitive polymer layers at the same time following applying and aligning the second substrate to the first substrate and following applying and aligning the first substrate to the third substrate.

In another embodiment, forming the first semiconductor device on the first substrate comprises forming multiple first semiconductor devices on a common wafer, each of the multiple first semiconductor devices having a corresponding first interconnect and a corresponding conductive via, and the method further comprises scribing the multiple first semiconductor devices to separate the multiple first semiconductor devices prior to applying and aligning one of multiple second substrates to each of the first substrates.

In another embodiment, forming the second semiconductor device comprises forming. multiple second semiconductor devices on a common wafer, each of the multiple second semiconductor devices having a corresponding second interconnect, and the method further comprises scribing the multiple second semiconductor devices to separate the multiple second semiconductor devices prior to applying and aligning one of the multiple second substrates to each of the first substrates.

In another embodiment, providing a photosensitive polymer layer on the first surface of the second substrate is performed before scribing the multiple second semiconductor devices.

In another embodiment, the method further comprises partially curing the photosensitive polymer layer prior to applying and aligning the second substrate to the first substrate.

In another embodiment, the method further comprises curing the photosensitive polymer layer following applying and aligning the second substrate to the first substrate.

In another embodiment, forming the first semiconductor device on the first substrate comprises forming multiple first semiconductor devices on a common first wafer; each of the multiple first semiconductor devices having a corresponding first interconnect and a corresponding conductive via, and forming the second semiconductor device comprises forming multiple second semiconductor devices on a common second wafer, each of the multiple second semiconductor devices having a corresponding second interconnect and applying and aligning the second substrate to the first substrate comprises contemporaneously applying and aligning the multiple second semiconductor devices on the second wafer to the multiple first semiconductor devices on the first wafer.

In another embodiment, the method further comprises scribing the first and second wafers to separate the multiple corresponding first and second semiconductor devices following contemporaneously applying and aligning the multiple second semiconductor devices on the second wafer to the multiple first semiconductor devices on the first wafer.

In another embodiment, providing a photosensitive polymer layer on the first surface of the second substrate is performed before scribing the first and second wafers.

In another embodiment, the method further comprises partially curing the photosensitive polymer layer prior to applying and aligning the multiple second semiconductor devices of the second wafer to the multiple first semiconductor devices of the second wafer of the first wafer.

In another embodiment, the method further comprises curing the photosensitive polymer layer following applying and aligning the multiple second semiconductor devices of the second wafer to the multiple first semiconductor devices of the second wafer of the first wafer.

In another embodiment, the photosensitive polymer layer is a material selected from the group consisting of: polymide, poly-benz-oxazole (PBO), benzo-cyclo-butene (BCB), epoxy, novolak, melamine-phenol, acrylate, and elastomer.

In another embodiment, the photosensitive polymer layer includes a photo active component and a bonding agent.

In another aspect, the present invention is directed to a semiconductor device comprising: a first semiconductor device on a first substrate, the first semiconductor device including a first bonding pad on a first surface of the first substrate in a device region of the first semiconductor device; a first interconnect on the first surface of the first substrate, the first interconnect electrically coupled to the first bonding pad; a conductive via through the first substrate, the conductive via being electrically coupled to the first interconnect and extending through a second surface of the first substrate opposite the first surface; a second semiconductor device on a second substrate, the second semiconductor device including a second bonding pad on a first surface of the second substrate in a device region of the second semiconductor device; a second interconnect on the first surface of the second substrate, the second interconnect electrically coupled to the second bonding pad; and a photosensitive polymer layer between the first surface of the second substrate and the second surface of the first substrate that bonds the first and second substrates, the conductive via extending through the photosensitive polymer layer and contacting the second interconnect to electrically couple the first bonding pad to the second bonding pad.

In one embodiment, the photosensitive polymer layer is patterned to expose a portion of the second interconnect to enable contact with the conductive via.

In another embodiment, the first interconnect extends across the first surface of the first substrate in a direction toward an outer edge of the first substrate and wherein the second interconnect extends across the first surface of the second substrate in a direction toward an outer edge of the second substrate.

In another embodiment, the conductive via is positioned in a scribe lane region of the first semiconductor device.

In another embodiment, the conductive via is positioned in a device region of the first semiconductor device.

In another embodiment, the device further comprises a conductive layer on an upper surface of the second interconnect.

In another embodiment, a distal end and a portion of distal sidewalls of the conductive via extend beyond the second surface of the first substrate.

In another embodiment, the first semiconductor device on the first substrate and the second semiconductor device on the second substrate are formed on a common semiconductor wafer.

In another embodiment, the first semiconductor device on the first substrate and the second semiconductor device on the second substrate are formed on separate first and second semiconductor wafers.

In another embodiment, the photosensitive polymer layer comprises a first photosensitive polymer layer and the device further comprises: a third substrate including a third bonding pad on a first surface of the third substrate; and a second photosensitive polymer layer between the first surface of the third substrate and the first surface of the first substrate that bonds the first and third substrates, the third bonding pad and the first interconnect being electrically coupled to each other through the second photosensitive polymer layer.

In another embodiment, the third substrate comprises a substrate selected from the group consisting of: printed circuit board (PCB), semiconductor device substrate, and package interposer.

In another embodiment, the photosensitive polymer layer is a material selected from the group consisting of: polymide, poly-benz-oxazole (PBO), benzo-cyclo-butene (BCB), epoxy, novolak, melamine-phenol, acrylate, and elastomer.

In another embodiment, the photosensitive polymer layer includes a photo active component and a bonding agent.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

Figure 1:
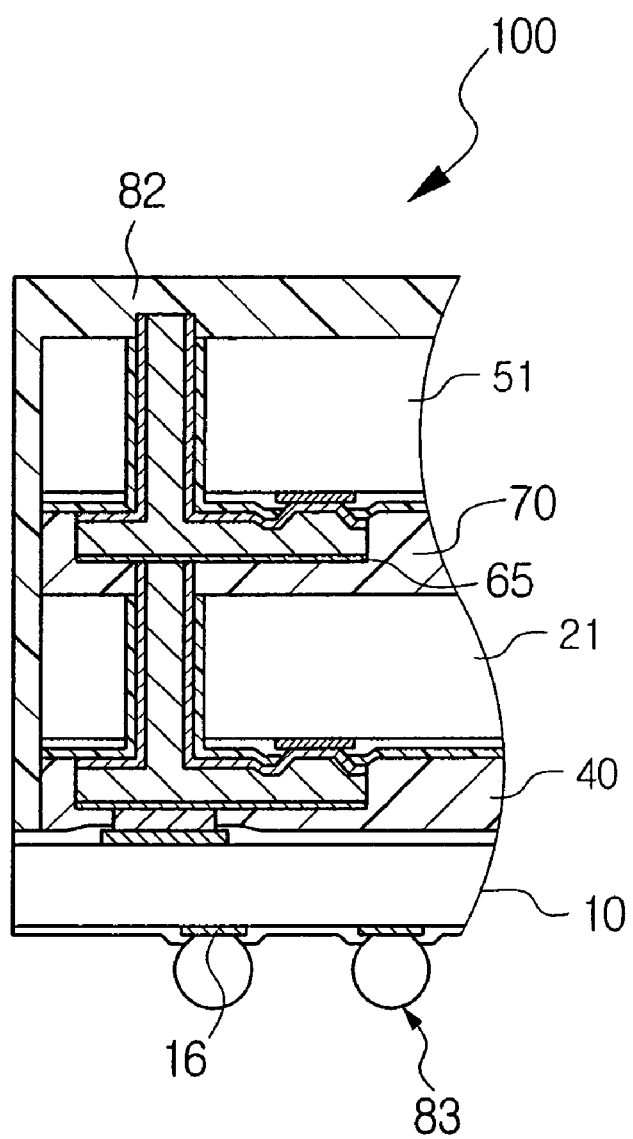
FIG. 1 is a sectional view of a stacked chip package in accordance with the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings and related description, if a first layer is referred to as being "on" another layer, the first layer can be directly on the other layer, or intervening layers may be present. Like numbers refer to like elements throughout the specification.

FIG. 1 is a sectional view of a stacked chip package in accordance with the present invention. A stacked chip package according to the embodiment of FIG. 1 includes a printed. circuit board 10, upon which a chip stack including a first chip 21 and a second chip 51 are mounted. The first chip 21 is mechanically bonded to the printed circuit board 10 by a first photosensitive polymer layer 40. The second chip 51 is mechanically bonded to the first chip 21 using a second photosensitive polymer layer 70. The resulting multiple chip package is encapsulated using a protective encapsulating material 82 such as epoxy. Solder balls 83 are connected to ball pads 16 at an outer surface of the printed circuit board 10 to provide for external package interconnectivity. The embodiment of the invention as depicted in FIG. 41 can be manufactured using chip-level bonding and wafer-level bonding processes.

FIGS. 2 through 13 are sectional views of a method for fabricating a stacked chip package, in accordance with a first embodiment of the present invention. In the first embodiment, a chip-level bonding process is employed.

Figure 2:
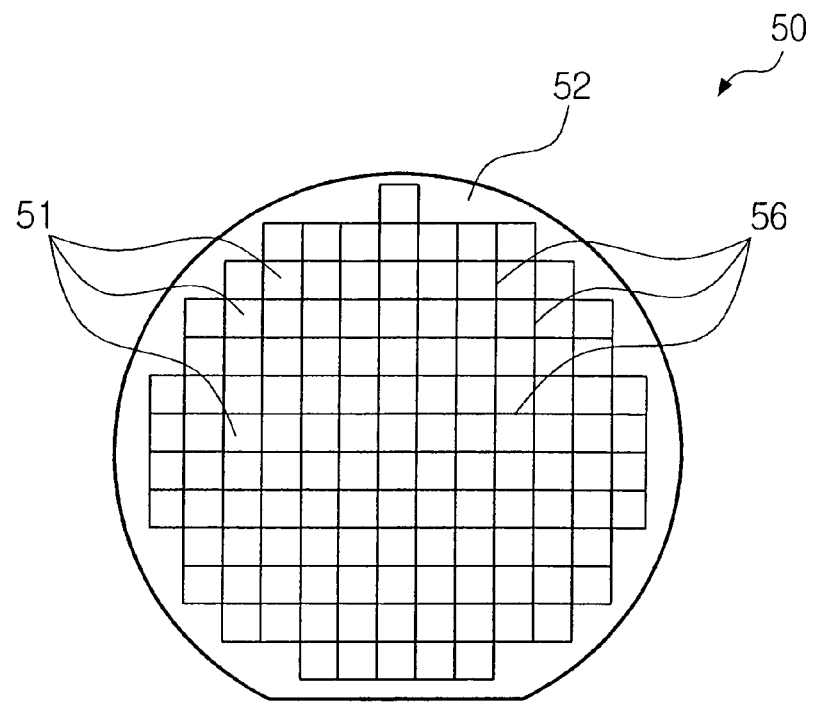
FIGS. 2 through 13 illustrate a method for fabricating a stacked chip package, in accordance with a first embodiment of the present invention.

Referring to FIG. 2, a wafer 50 includes a plurality of semiconductor chips 51 formed on a wafer substrate 52, that are defined between scribe lanes 56 of the wafer 50. The chips 51 are separated into dies by dicing them along the scribe lane 56.

Figure 3:
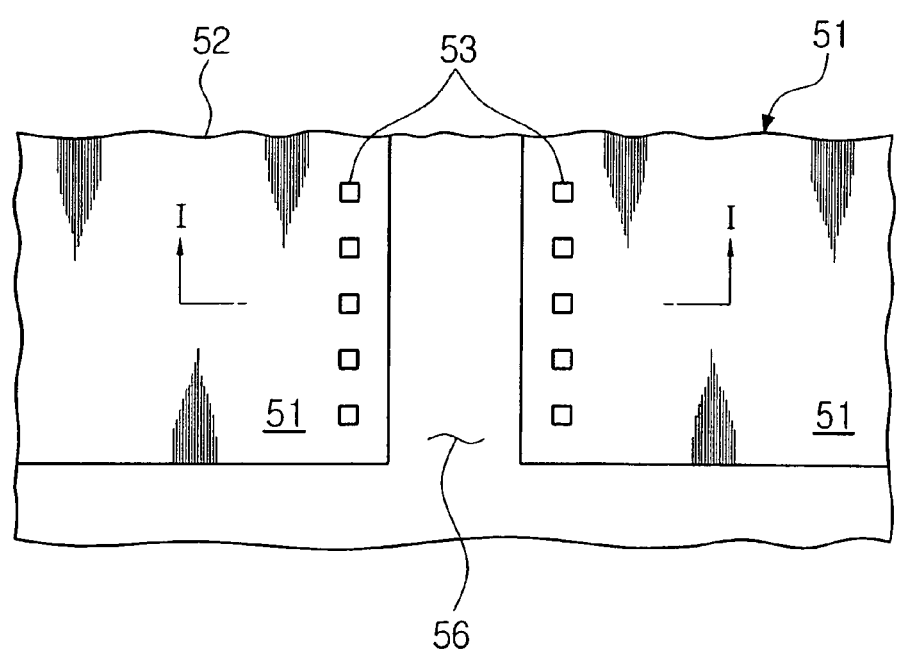
Figure 4A:
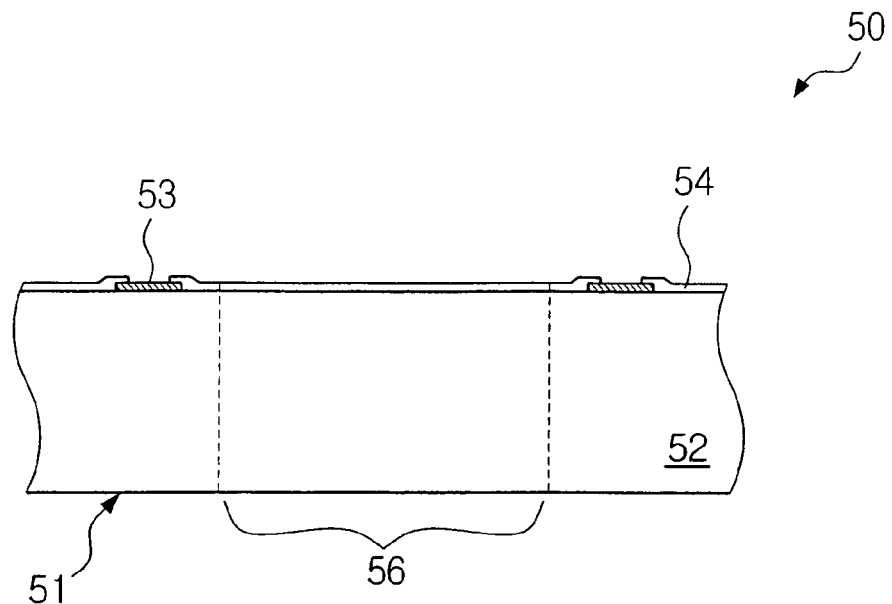

Referring to FIG. 3, each semiconductor chip 51 typically includes a plurality of bonding pads 53 about the perimeter of the chip 51, proximal to the scribe lanes 56. The bonding pads 53 are used for routing signals to and from locations that are external to the chip 51;

FIGS. 4A-4H are cross-sectional views of two adjacent chips 51 in a region of the scribe lane 56 for example, along section line I-I of FIG. 3, illustrating the formation of vertical interconnect vias and horizontal conductive interconnects, in accordance with the present invention. Referring to FIG. 4A, each chip 51 includes a semiconductor device that is formed in the substrate 52, and each chip includes a plurality of bonding pads 53, or interconnect pads, to provide for external signal communication. A dielectric layer 54 is provided on a top surface of the substrate 52 including the semiconductor devices.

Figure 4B:
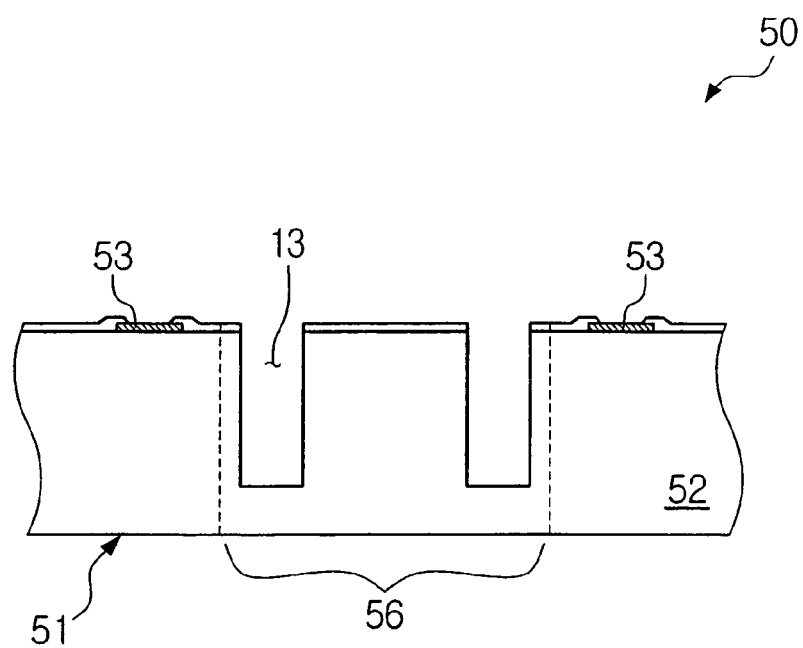
Figure 4C:
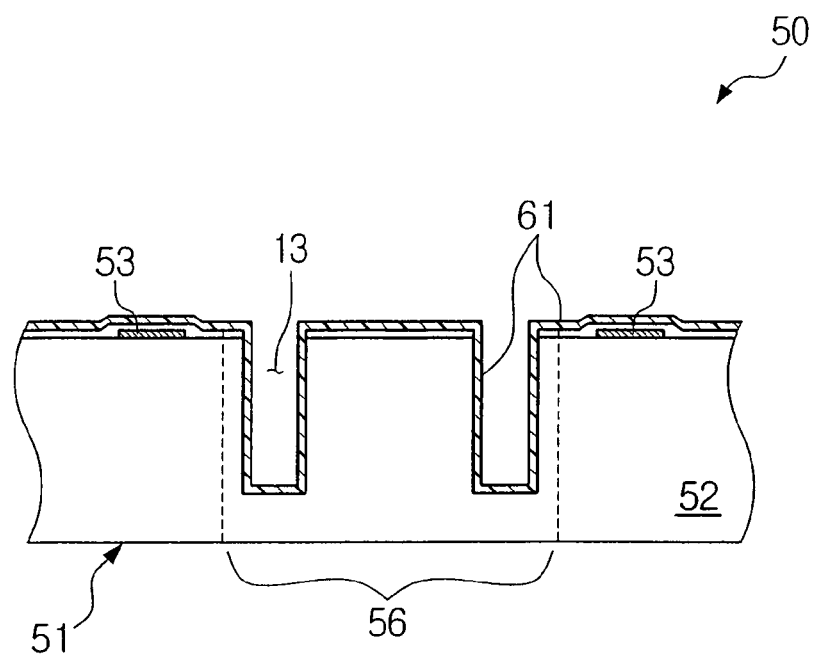
Figure 4D:
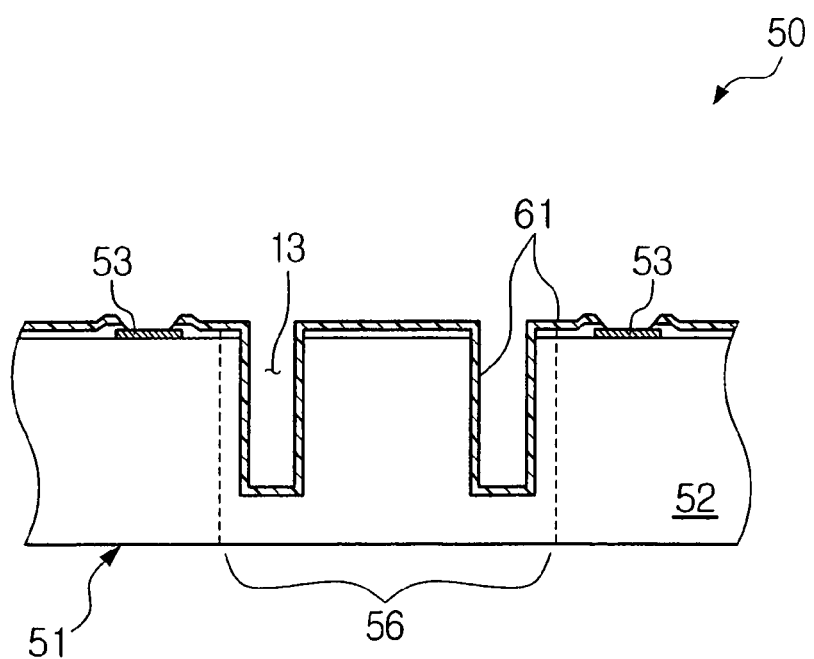
Figure 4E:
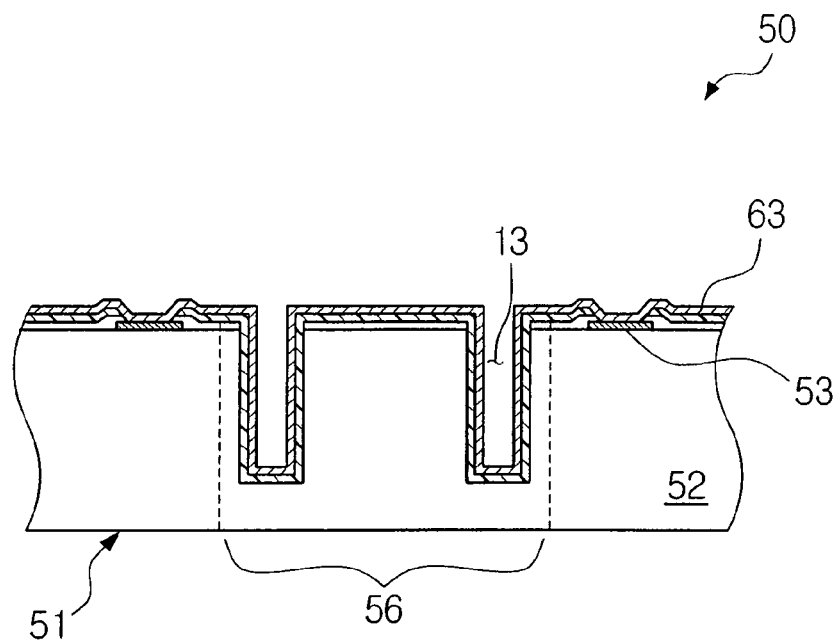
Figure 4F:
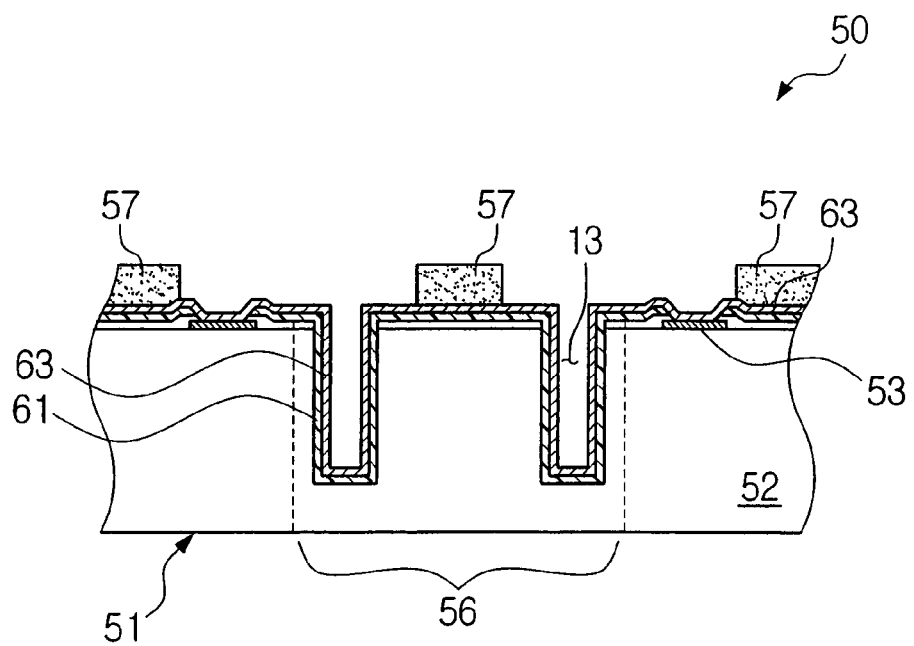
Figure 4G:
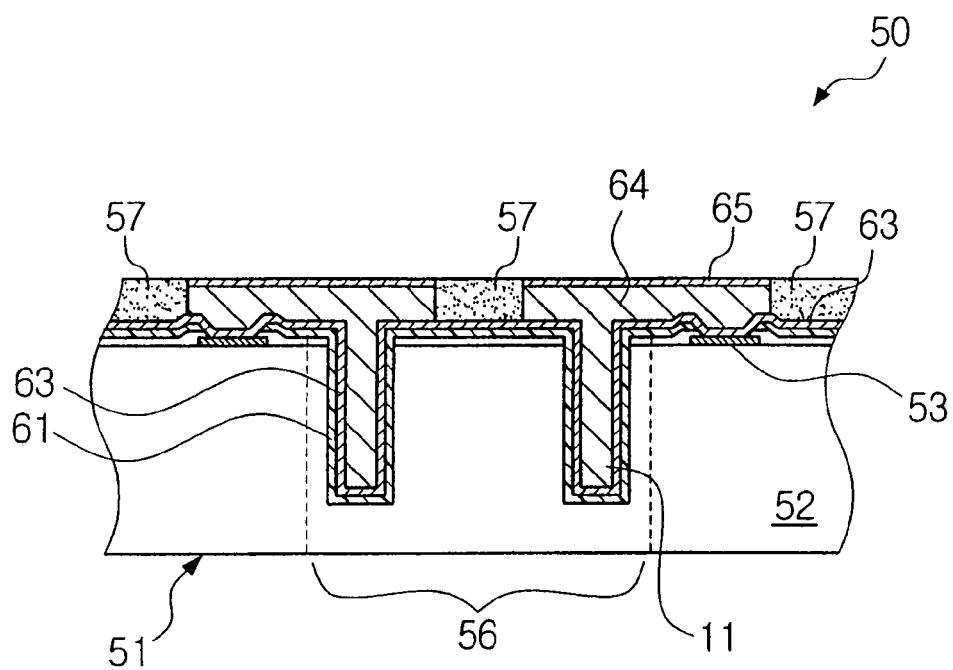

Referring to FIG. 4B, a plurality of via holes 13 are formed in the scribe lane 56, for example using a drilling process, a laser drilling process, or a plasma etching process. The via holes 13 each correspond with one of the bonding pads 53 and are formed partially through the substrate 52. Referring to FIG. 4C, an isolation layer 61 is formed on the resulting structure, including the via holes 13 to cover inner sidewalls and bottom portions of the via-holes 13. Referring to FIG. 4D, the isolation layer 61 is then patterned to expose the bonding pads 53. Referring to FIG. 4E, a barrier metal layer 63 is formed on the isolation layer 61 in the via holes 13 and on the substrate 52, and contacts the underlying bonding pads 53. In various embodiments, the barrier metal layer 63 comprises a stacked metal structure for example, at least one of Ti/Cu, Ti/TiN/Cu, Ta/Cu, Ta/TaN/Cu, and Ti/Au/Cu. Referring to FIG. 4F, a photoresist layer 57 is formed and patterned to expose the barrier metal layer 63 between the point of contact with the underlying bonding pad 53, and the bottom of the via hole 13. Referring to FIG. 4G, the region between the photoresist layer pattern 57 including the via hole 13 is then filled with a metal layer 64, such as electroplated copper or gold, to form a vertical interconnect via 11 extending in a vertical direction in the via hole 13, and a re-distribution line extending in a horizontal direction between the vertical interconnect via 11 and the bonding pad 53. The combination of the vertical interconnect via 11 and the horizontal re-distribution line is referred to herein collectively as a metal interconnect 64. The metal interconnects 64 each extend in a horizontal direction along a horizontal portion from a point of contact with the corresponding bonding pad 53 in the device region into the scribe lane region 56, and in a vertical direction along a vertical portion from the horizontal portion and into the via hole 13, which is filled by the vertical portion of the interconnect to form a vertical interconnect via 11 therein. An optional conductive layer 65 is applied to a top surface of the metal layer 64 of the interconnects to promote adhesion in a subsequent bonding process. The conductive layer 65 comprises, for example, low melting point metals such as solder applied using electroplating techniques or adhesion-promoting metals such as Ni, NiV, Cr and Pd.

Figure 5:
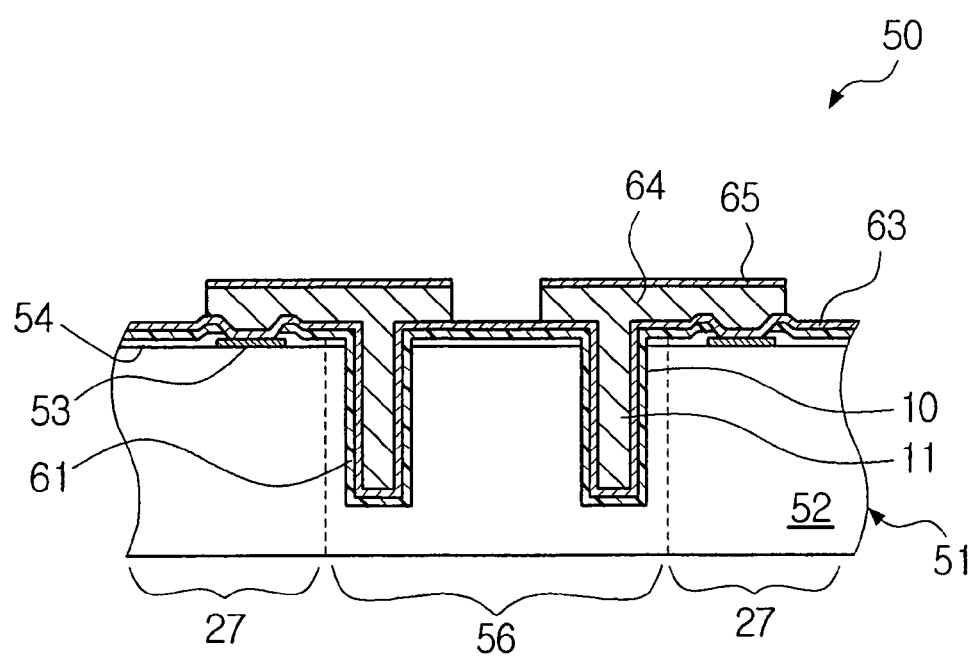

Referring to FIG. 5, the photoresist pattern 57 used to define the metal interconnects 64 is then stripped using a standard photoresist removal process. Although the vias 11 are shown in FIG. 5 as being formed in the scribe lane region 56 of the device, the vias can optionally be formed in the device region 27 of the device.

Figure 6:
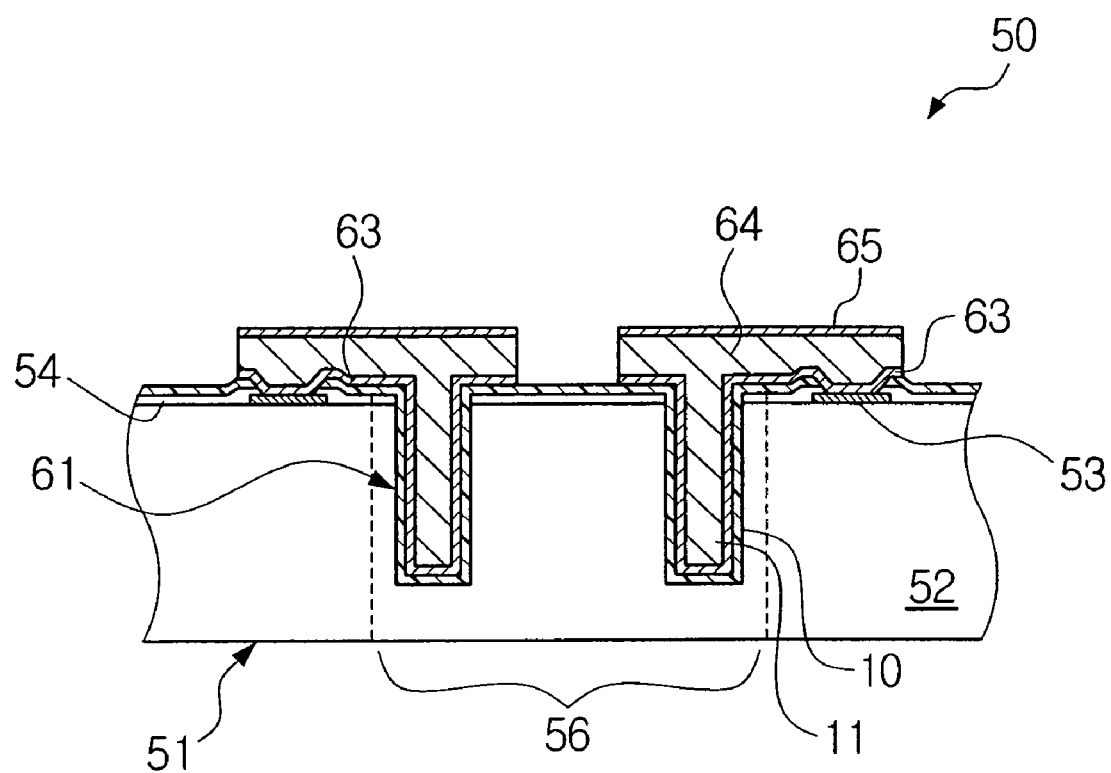

Referring to FIG. 6, the exposed portions of the barrier metal layer 63 of the second wafer 50, are removed, for example, using standard etching techniques., This step isolates the interconnects 64 and vertical vias 11 on opposite sides of the scribe line 56.

Figure 7A:
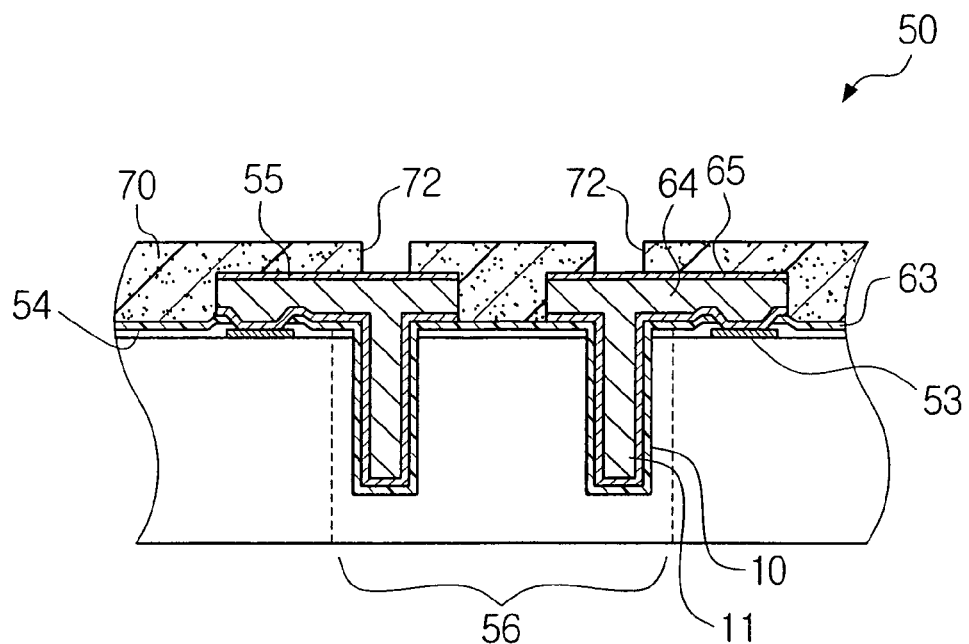
Figure 7B:
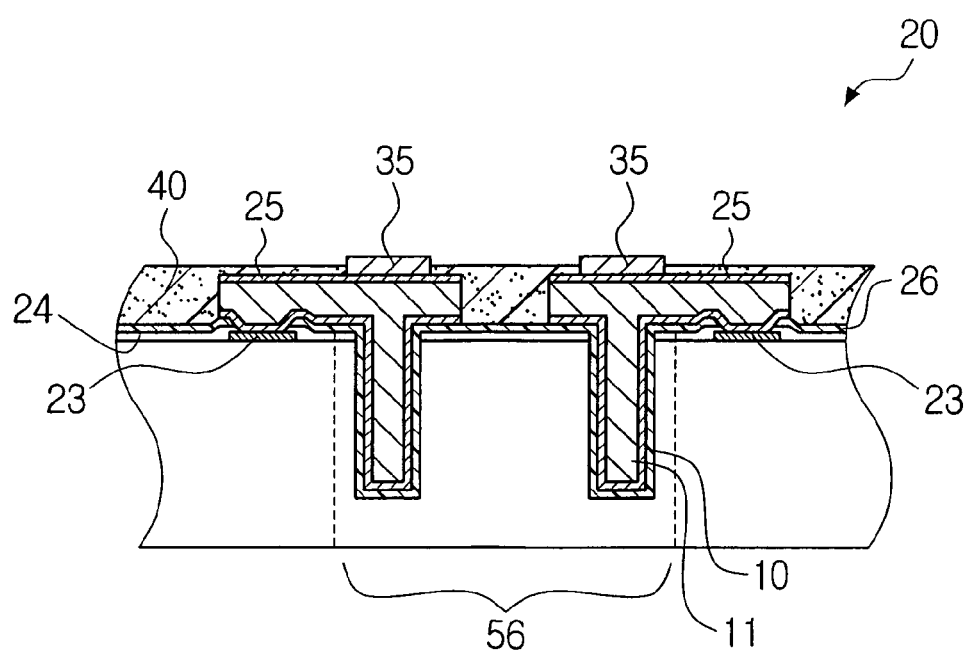

FIGS. 7A and 7B, are sectional views of first and second wafers 20, 50 including first and second chips to be stacked, according to the present invention. Following the process of FIG. 5, the first wafer 20 is processed separately from the second wafer 50. FIG. 7A is representative of a second wafer 50 that includes second chips that are to be stacked on an upper level of a chip stack; that is, on a level that is above a first chip in the stack. FIG. 7B is representative of a first wafer 20 that includes first chips that are to be stacked on a first level of a chip stack, that is, on a level that is directly above a printed circuit board, or other base substrate, of the stack package.

Referring to FIG. 7A, a second photosensitive polymer layer 70 is formed and patterned on the surface of the second wafer 50. The second photosensitive polymer layer 70 is patterned to expose the underlying conductive layer 65 in a region above the via hole 13 to provide pad windows 72.

Referring to FIG. 7B, a photoresist layer (not shown) is coated and patterned on the surface of the first wafer 20 to open windows for connecting pads 35. The windows are then filled with a conductive layer to form the connecting pads 35. An electroplating method can be used to form the connecting pad 35, such as electroplating of solder or Au material, as described above. Following formation of the connecting pads 35, the photoresist layer is stripped and the exposed portions of the barrier metal layer 63 of the first wafer 20 are removed, for example, using standard etching techniques. This step isolates the interconnects 64 and vertical vias 11 of the first wafer 20 on opposite sides of the scribe line 56. A first photosensitive polymer layer 40 is then applied and patterned to expose the connecting pads 35 of the first wafer 20.

The photosensitive polymer layers 40, 70 comprise, for example, a thermosetting polymer that contains a photoactive component, a plasticizer, a cross-linkable agent and a polymer resin. For example, the photosensitive polymer layer can comprise at least one material selected from the group consisting of: polymide, poly-benz-oxazole (PBO), benzo-cyclo-butene (BCB), epoxy, novolak, melamine-phenol, acrylate, and elastomer.

Following initial application to the upper surfaces of the first and second wafers 20, 50, each of the photosensitive polymer layers 40, 70 is partially cured, so that it has a mechanically stable structure, yet retains its adhesive properties. The photosensitive polymer layer is partially cured and cross-linked, for example beta-stage cured, by heating the layer to a temperature less than the temperature required for fully curing the layer. For example, in one embodiment, the photosensitive polymer layer is partially cured at a temperature such that the cure percentage is less than 100%, for example on the order of 33%-50%. At such a percentage, the phiotosensitive polymer layer is in a transition state between a liquid and a solid, and therefore, is operative as a mechanically stable layer that remains stable until the next process stage, while retaining its adhesion properties necessary for later mechanical bonding. Selection of the photosensitive polymer layer is based primarily on the thermal stability of the devices on the corresponding chips. For example, DRAM devices have a thermal stability on the order of 200 C, so an ideal photosensitive polymer layer for such a device would have a partial curing temperature on the order of about 150 C. Low-temperature curable elastomer, PBO, epoxy, acrylate and novolak are well-suited for DRAM device application. NAND flash devices, on the other hand, have thermal stability on the order of about 400 C, so an ideal photosensitive polymer layer for such a device would have a partial curing temperature on the order of about 300 C. BCB, melamine-phenol and polymide as well as the aforementioned low-temperature curable polymers are well-suited for NAND flash device applications.

Figure 8:
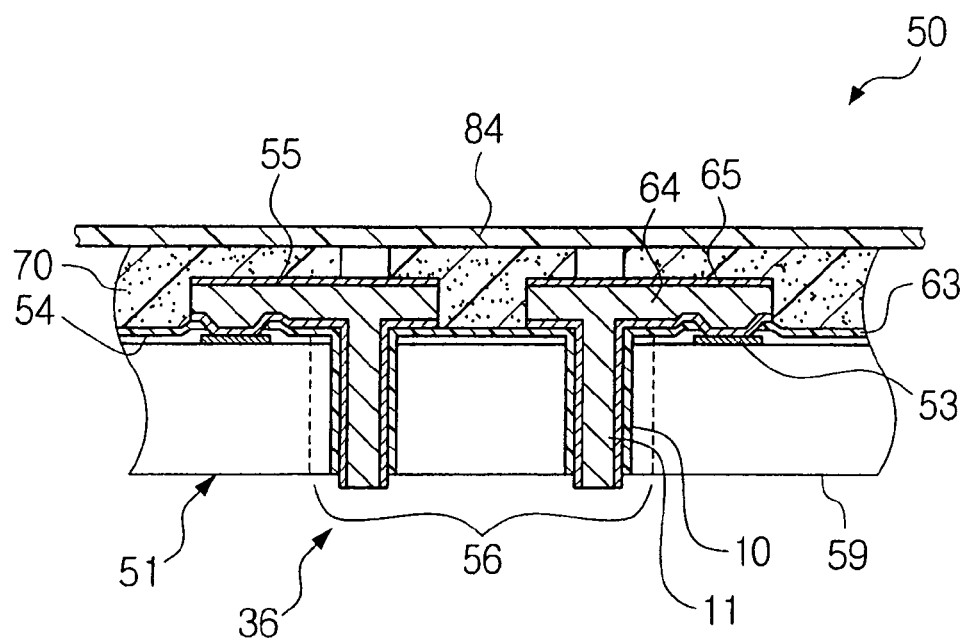

Referring to FIG. 8, the bottom surface 59 of the second wafer 50 is partially removed to thin the wafer using, for example, mechanical grinding and/or chemical-mechanical polishing until bottom portions of the vertical interconnect vias 11 are reached. The bottom surface 59 of the second wafer 50 is then etched, for example using wet etch and/or dry etch, to remove additional substrate material and the isolation layer 61 from the bottom portions of the vertical vias 11. In this manner, via connecting bumps 36 extend or protrude from the bottom surface 59 of the second wafer 50. A protective layer 84 for the grinding process can be used during this step to protect the top surface of the second wafer 50 during substrate removal by the grinding and wet/dry etching process. The backside of the first wafer 20 shown in FIG. 7B can be ground and etched using similar processes to expose the vertical interconnect vias 11 and to form interconnect via bumps in a similar manner.

Figure 9A:
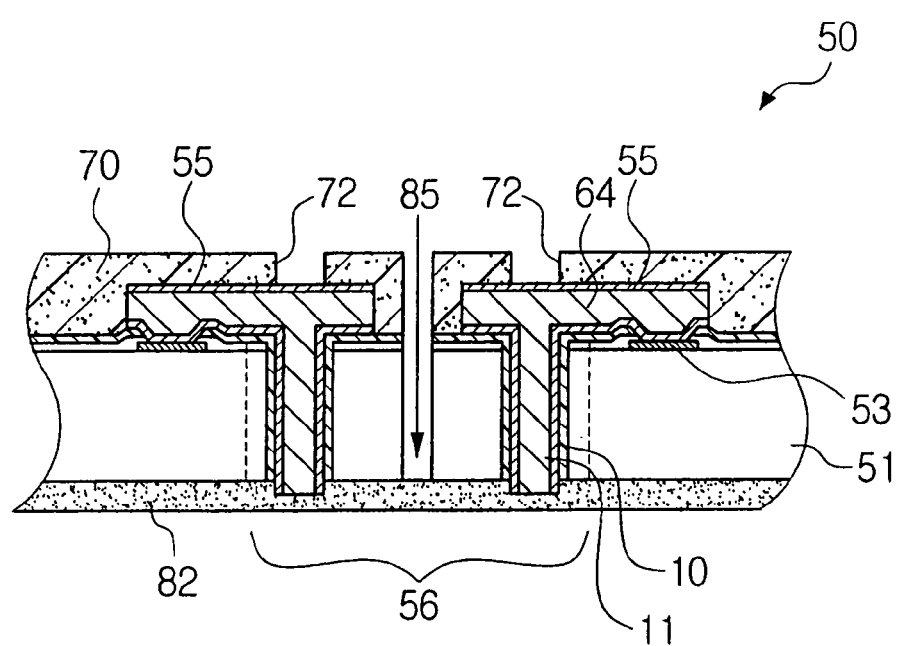
Figure 9B:
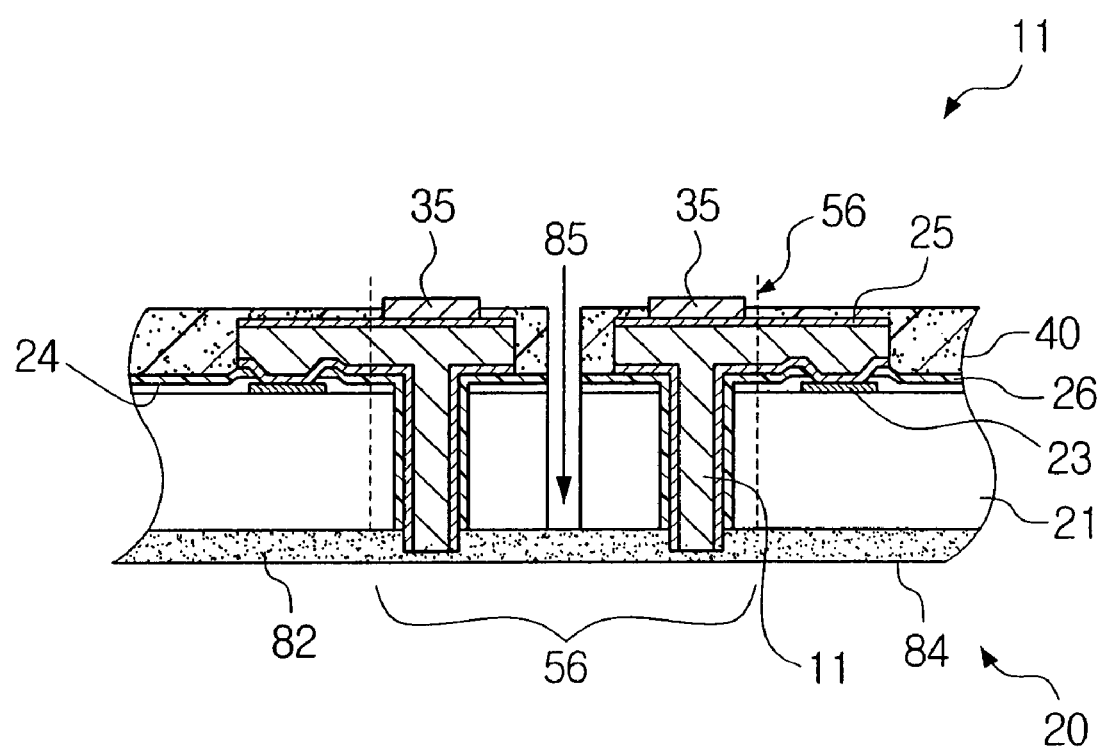

Referring to FIG. 9A, dicing tape 82 is applied to the bottom surfaces of the first wafer 20 and the second wafer 50 and then the protective layer 84 is removed from the upper surfaces of the first wafer 20 and the second wafer 50. The wafers 20, 50 are then diced 85 in their scribe lanes 56 between adjacent interconnects 64, 25, and interconnect vias 11, according to conventional techniques. In this manner, the second wafer 50 is separated into second chips 51 and first wafer 20 is separated into first chips 21. An ultraviolet exposure process removes the protection tape 82, thereby fully separating the first chips 21 and second chips 51.

Figure 10:
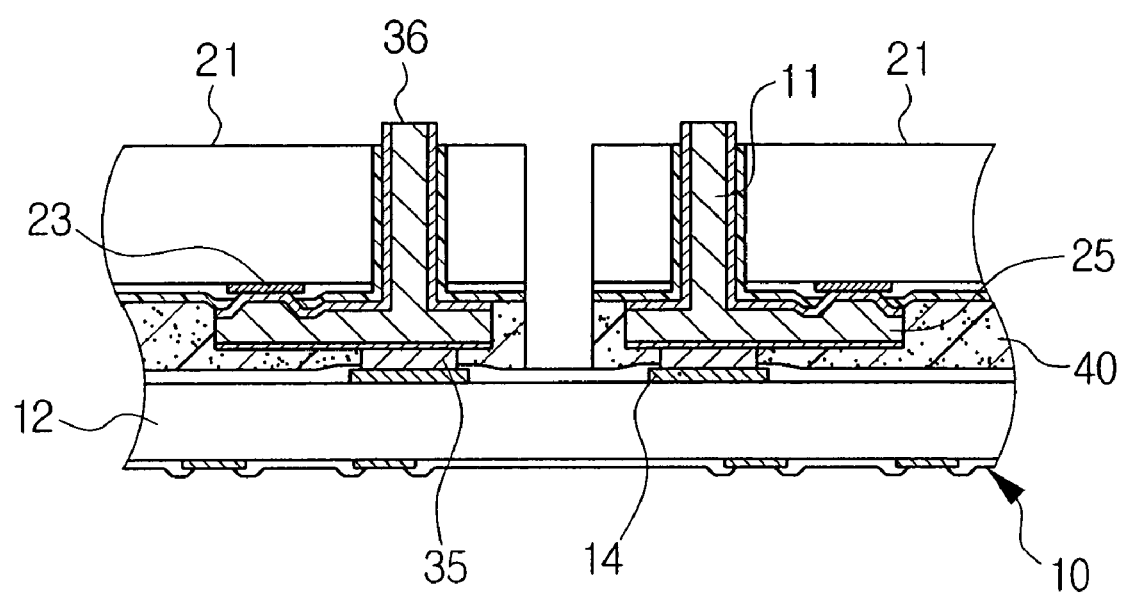

Referring to FIG. 10, the top surfaces of the separated first chips 21 are applied to a top surface of a printed circuit board 10. The printed circuit board 10 includes a plurality of chip bonding pads 14, that serve as an interconnect location for conductive paths on the printed circuit board 10. The connecting pads 35 of the first chips 21 are aligned with the chip bonding pads 14 and bonded together. During stacking of the first chips 21 on the printed circuit board 10, the photosensitive polymer layer 40 of the first chips 21 completely fills the gap, or space, between the first chips 21 and the region of the printed circuit board 10 designated for bonding to the first chips.

Figure 11:
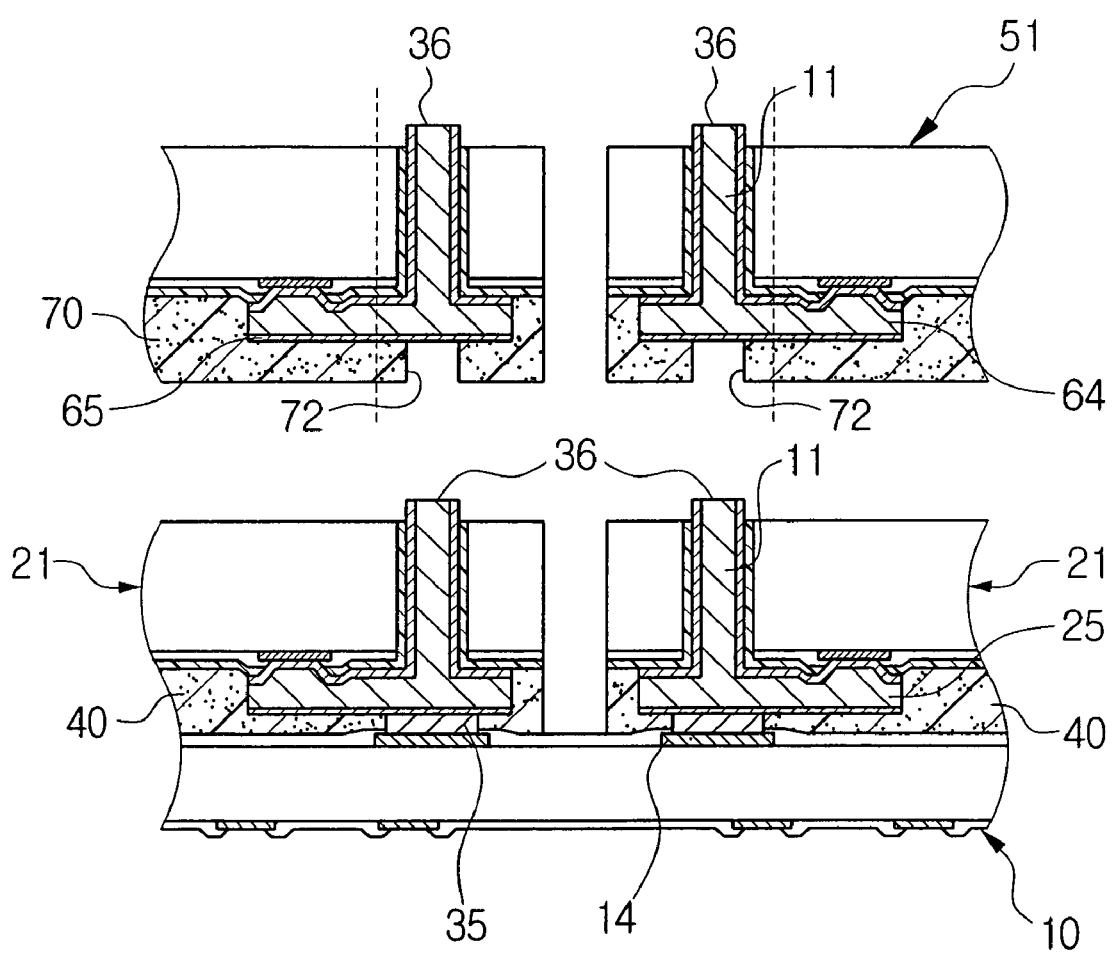

Referring to FIG. 11, top surfaces of the separated second chips 51 are applied to the bottom surfaces of the first chips to stack the second chips 51 on the first chips 21. Pad windows 72 of the second chips 51 exposing the underlying conductive layers 65 are aligned with the connecting bumps 36 of the first chips 21. During stacking of the second chips 51 on the first chips 21, the photosensitive polymer layer 70 of the second chips 21 completely fills the gap, or space between the second chips 51 and the first chips 21.

Figure 12:
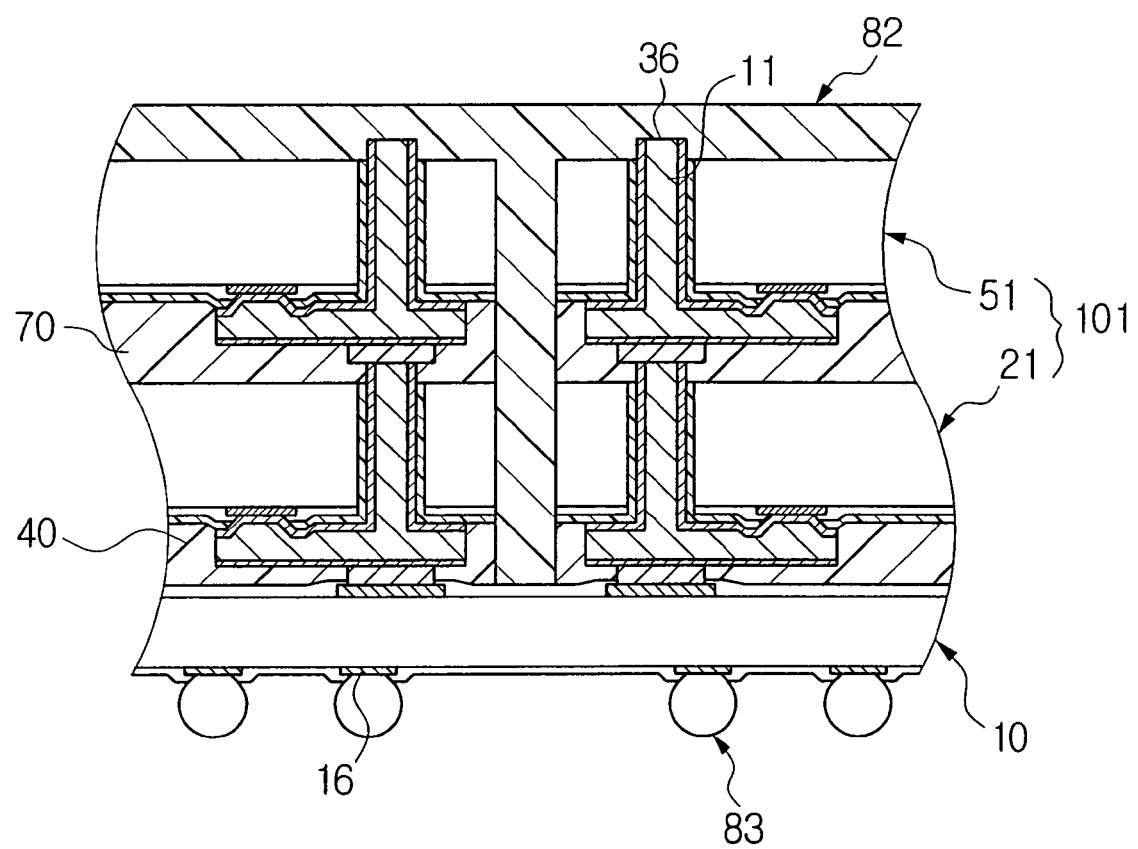

Referring to FIG. 12, additional chips can optionally be stacked on the first and second chips 21, 51, and when the chip stacking process is completed, a thermo-compression bonding process is performed, in order to obtain a full cure of the photosensitive polymer layers 40, 70 of each chip 21, 51 simultaneously. At the same time, the electrical bonding between the connecting bumps 36 with the conductive layers 65 and between the connecting pads 35 and the chip bonding pads 14 occurs as a result of the thermo-compression process. To perform thermo-compression bonding, after the stacked structure is prepared, the structure is mounted on a bonder chuck, and the bonder is heated to a pre-determined bonding peak temperature. When the pre-determined temperature is reached, the structure is exposed to the heated environment for a predetermined time period under pressure from the compressive force of a piston. The bonding peak temperature and time period are determined according to the desired extent of curing of the polymer layer and according to the desired flow of the compound of the conductive layers 65 and/or the connecting pads 35. Following the heating stage of the bonding process, the pressure of the piston is released and the stacked structure is cooled. Prior to the thermo-compression process, the photosensitive polymer layers 40, 70 and neighboring surfaces include dangling bonds. The thermo-compression process operates to connect the dangling bonds and to accelerate the bonding process.

Following the thermo-compression process, an encapsulating material 82 is formed over and between the chip stacks 101, each including chips 21, 51, and printed circuit board 10. The encapsulating material comprises, for example, epoxy molding compound (EMC) or other suitable material. Although shown in the FIG. 12 embodiment, the uppermost chip of the chip stack 101, in this case second chip 51, need not include a vertical via 11 and connecting bump 36. Solder balls 83 may be applied to ball pads 16 at an underside of the printed circuit board 10.

Figure 13:
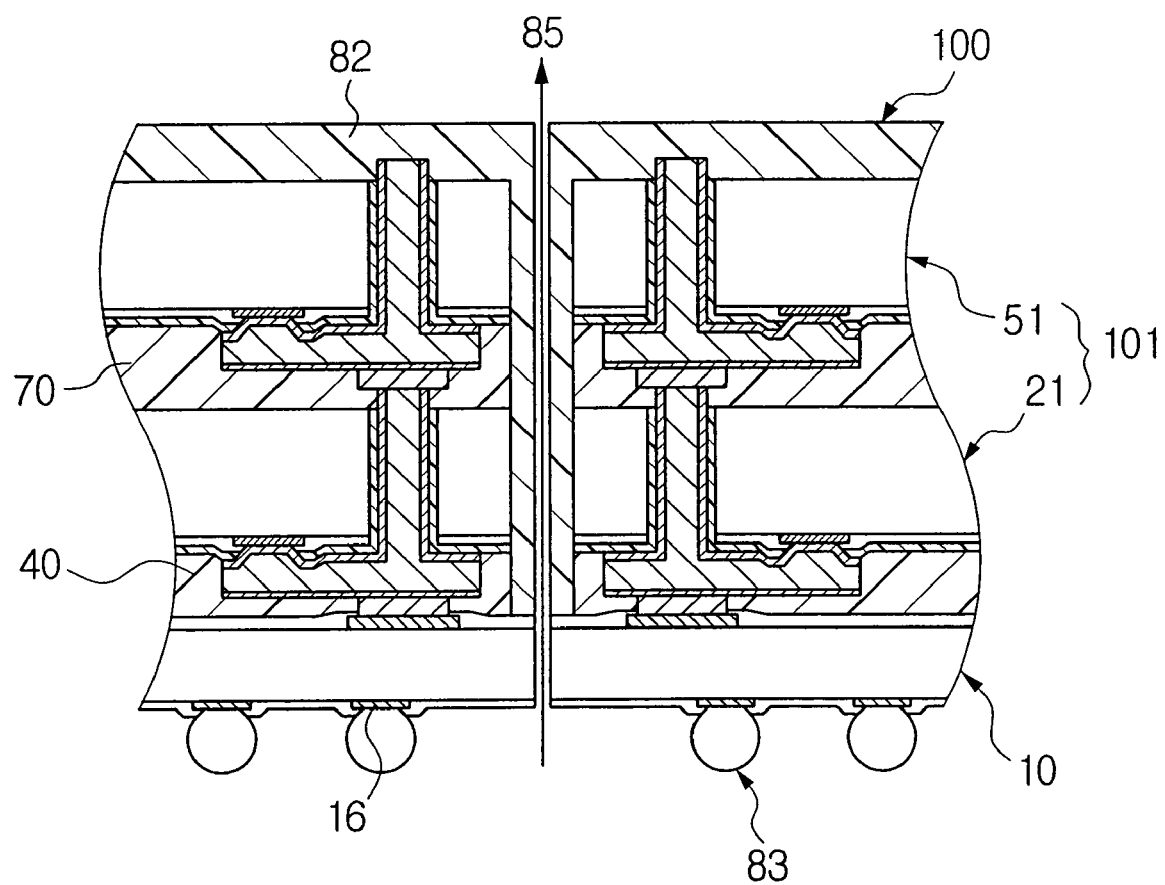

Referring to FIG. 13, the printed circuit board 10 is then diced 85 along the encapsulation material 82 line between to form independent, separated, chip stack packages 100.

Although stacking of two chips, namely first and second chips 21, 51, is shown and described in connection with the above example, the present invention is applicable to stacking of more than two chips. In addition, although the chip stack shown above is applied to a printed circuit board, other types of package bases are equally applicable to the present invention, including, for example, a semiconductor device substrate or a package interposer.

FIGS. 14 through 22 are sectional views of a method for fabricating a stacked chip package, in accordance with a second embodiment of the present invention. In the first embodiment above, separated chips are individually aligned and stacked on a substrate to form chip stack packages in a manner that is consistent with a chip level bonding configuration. In the present, second embodiment, entire wafers including multiple chips, or segments of such wafers including multiple chips are aligned and stacked, and applied to a substrate, prior to dicing of the chips in a manner that is consistent with a wafer level bonding configuration.

Figure 14:
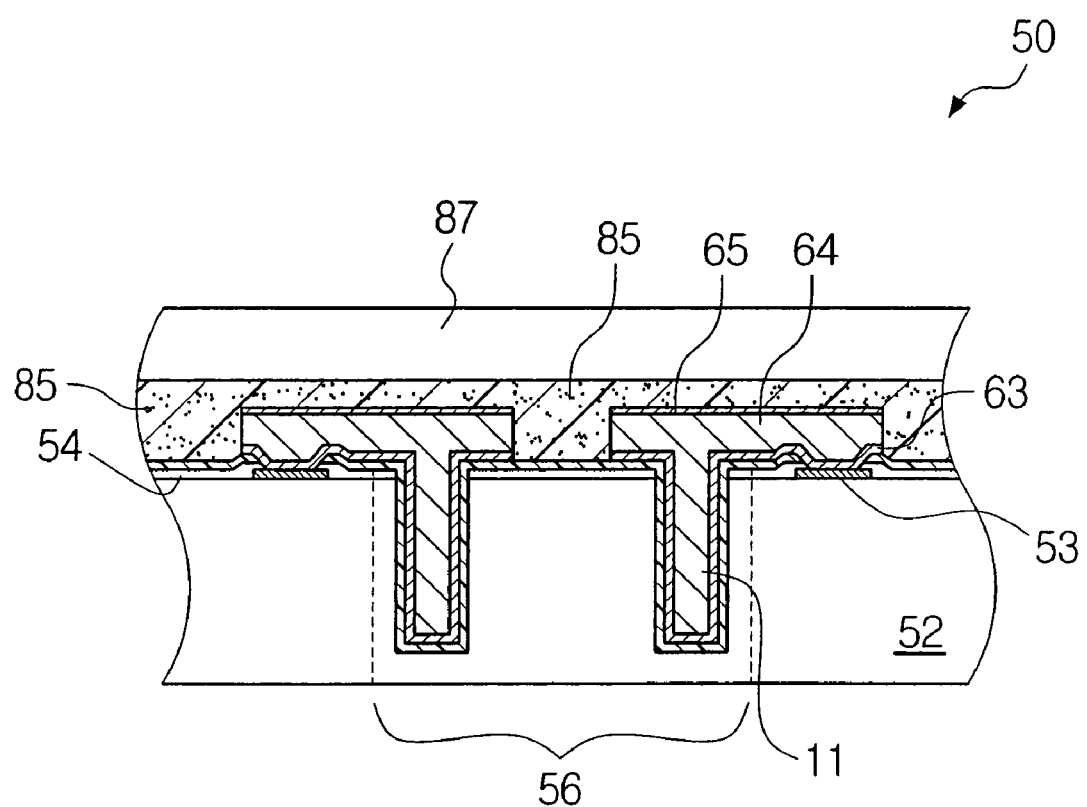
FIGS. 14 through 22 are sectional views of a method for fabricating a stacked chip package, in accordance with a second embodiment of the present invention.

Referring to FIG. 14, a second wafer 50 is prepared in accordance with the process shown above in FIGS. 1-6. A temporary adhesive 85 is applied to the resulting structure and a supporting board 87 is applied to a top surface of the temporary adhesive 85. The supporting board 87 maintains the mechanical stability of the wafer structure during a subsequent thinning process. In addition, the supporting board 87 prevents warping of the second wafer 50 following the wafer thinning process. Glass, and other transparent materials that have a coefficient of thermal expansion (CTE) that is matched with the substrate 52 material can be used for the supporting board 87. Materials that can be used for the temporary adhesive 85 include spin-on tape and ultraviolet light sensitive tape.

Figure 15:
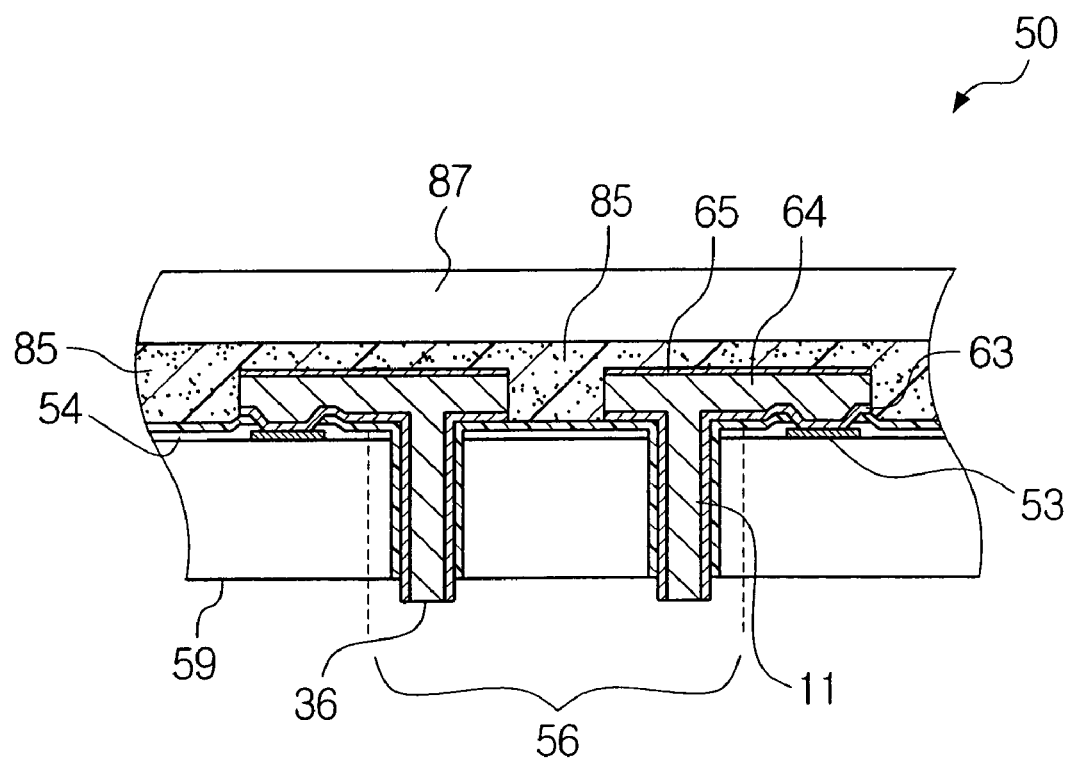

Referring to FIG. 15, following attachment of the supporting board 87, the backside 59 of the second wafer 50 is thinned in the manner described above in conjunction with FIG. 8.

Figure 16:
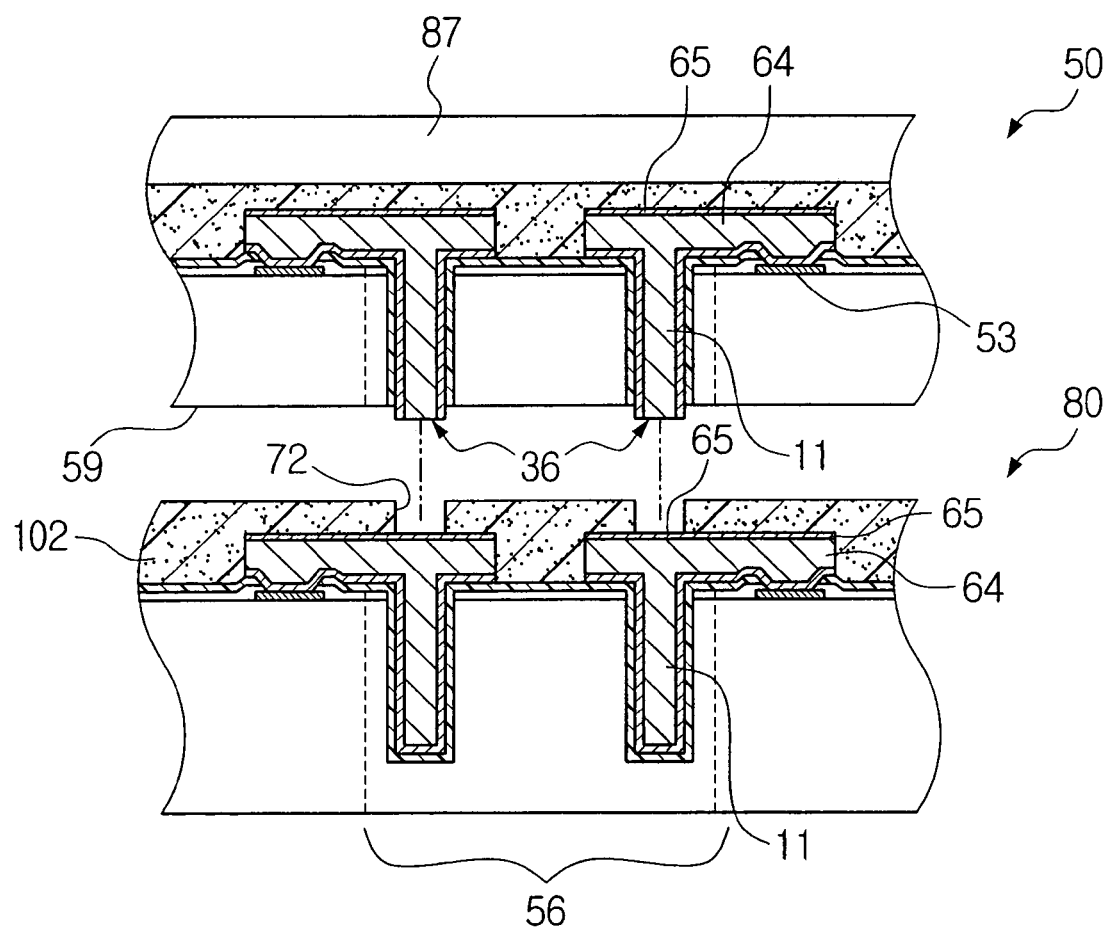

Referring to FIG. 16, the second wafer 50 including the supporting board 87 is stacked with a third wafer 80. The third wafer 80 is prepared in the same manner as the second wafer 50 of FIG. 7A, above, and includes a photosensitive polymer layer 102 that is applied to an upper surface thereof and patterned to form pad windows 72 that expose the underlying conductive layers 65 of the interconnects 64, as described above. The photosensitive polymer layer is beta-cured, or partly cured, prior to stacking, as described above. The connecting bumps 36 at a bottom surface of the second wafer 50 are aligned with the pad windows 72 and connected to the conductive layers 65 of the third wafer 80. The photosensitive polymer layer 102 operates to fill the gap between the third wafer 80 and the second wafer 50. A thermo-compression process is then performed on the stacked second wafer and third wafer 50, 80 to fully cure the photosensitive polymer layer 102 between the wafers.

In the present second embodiment as described, the stacked wafers are fully bonded at each layer application. In contrast, in the first embodiment described above, the separated chips are all stacked, and then all layers are fully bonded at the same time in a single thermo-compression process. In an alternative embodiments of the second embodiment, multiple wafer layers can be cured and bonded simultaneously in a common thermo-compression process. Additional wafers beyond the third wafer 80 can optionally be stacked on the second wafer 50 and third wafer 80 at this time, in a manner similar to the manner in which the third layer 80 was stacked to the second wafer 50.

Figure 17:
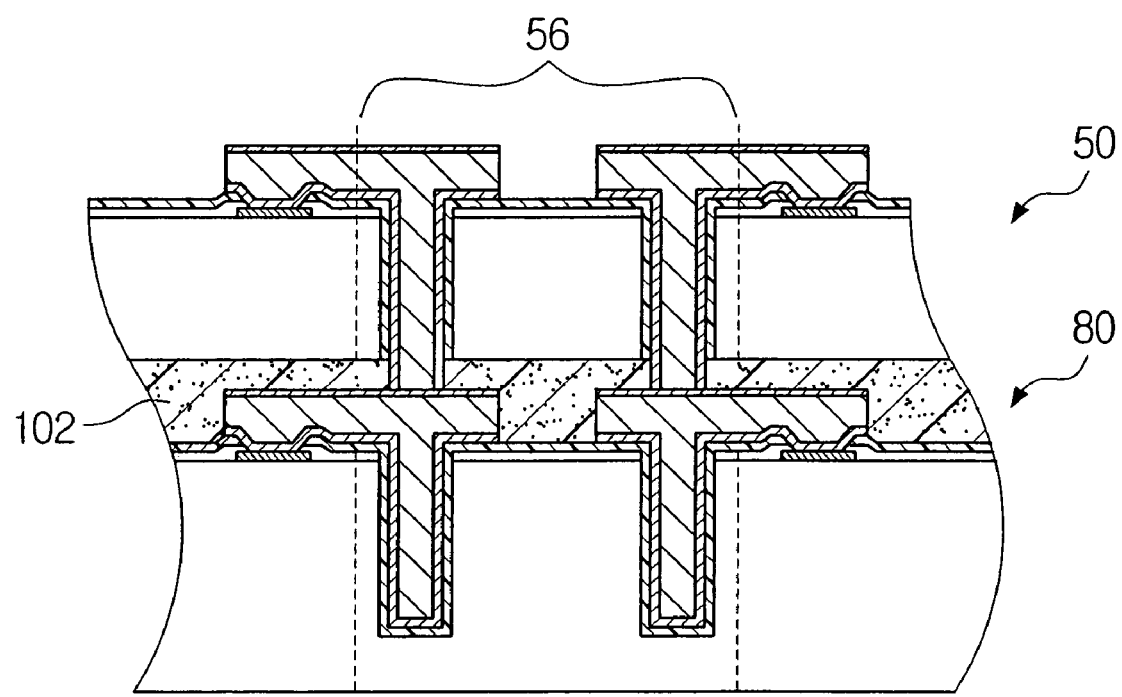

Referring to FIG. 17, the supporting board 87 and adhesive 85 are removed from the top surface of the second wafer 50 of the stacked second and third wafers 50, 80, for example using a thermal process or ultraviolet exposure.

Figure 18:
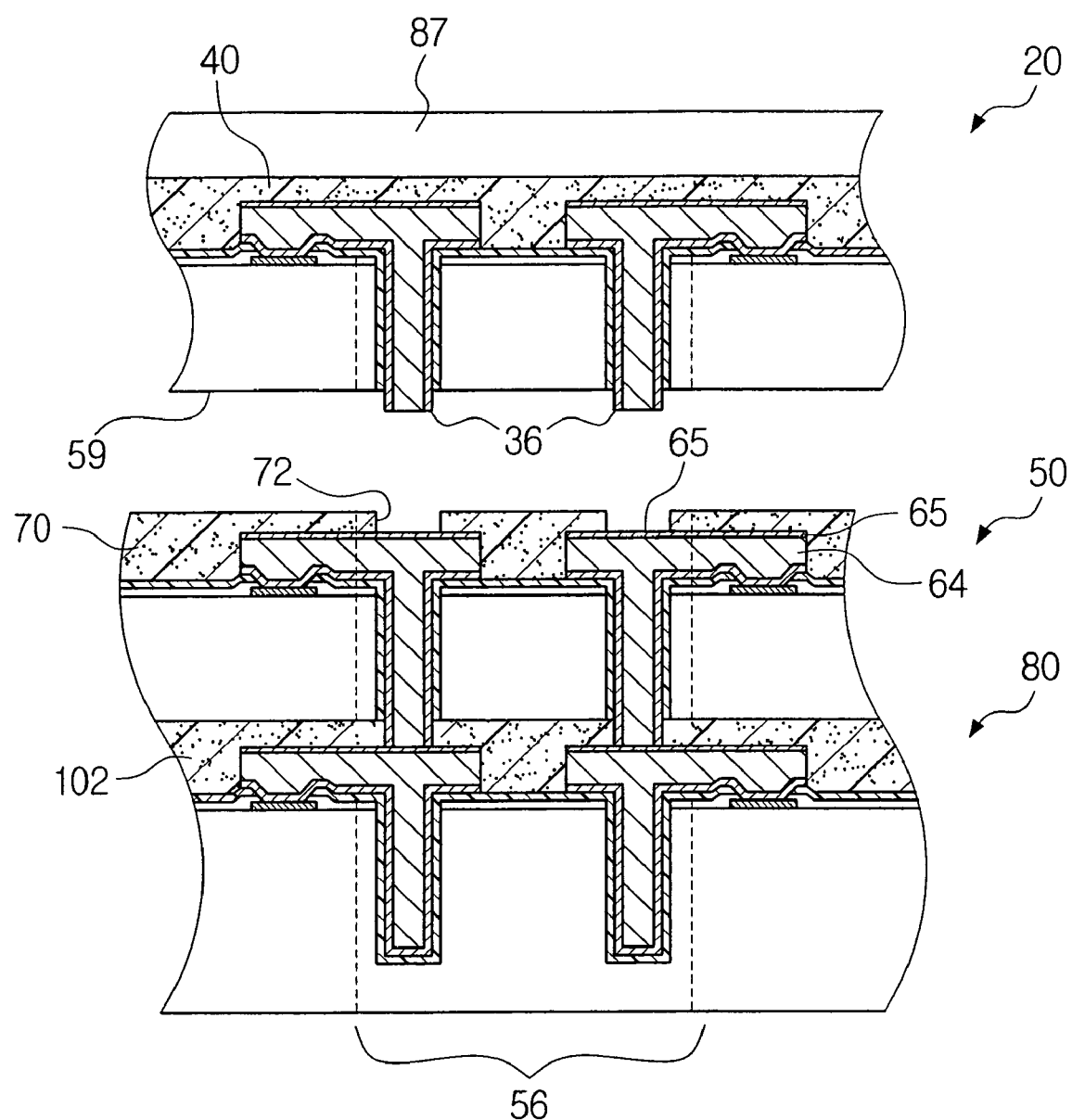

Referring to FIG. 18, a first wafer 20 is stacked onto an upper surface of the second wafer 50 of the stacked second and third wafers 50, 80. A photosensitive polymer layer 70 is applied to an upper surface the second wafer 50 and patterned to form pad windows 72 that expose the underlying conductive layers 65 of the interconnects 64 of the second wafer 50, as described above. Prior to stacking, the first wafer 20 undergoes a thinning process in the same manner as the second wafer 50, as described above in conjunction with FIGS. 14 and 15. A temporary adhesive 85 is applied to the top portion of the first wafer 20, and a supporting board 87, is applied to a top surface of the temporary adhesive 85. The supporting board 87 maintains the mechanical stability of the structure of the first wafer 20 the thinning process. In addition, the supporting board 87 prevents warping of the first wafer 20 following the wafer thinning process. Following attachment of the supporting board 87, the backside 59 of the first wafer 20 is thinned in the manner described above in conjunction with FIG. 8. The connecting bumps 36 at a bottom surface of the first wafer 20 are aligned with the pad windows 72 and connected to the conductive layers 65 of the second wafer 50. The photosensitive polymer layer 70 operates to fill the gap between the first wafer 20 and the second wafer 50. A thermo-compression process is then performed on the stacked first wafer and second wafer 20, 50 to fully cure the photosensitive polymer layer 70 between the wafers 20, 50.

Figure 19:
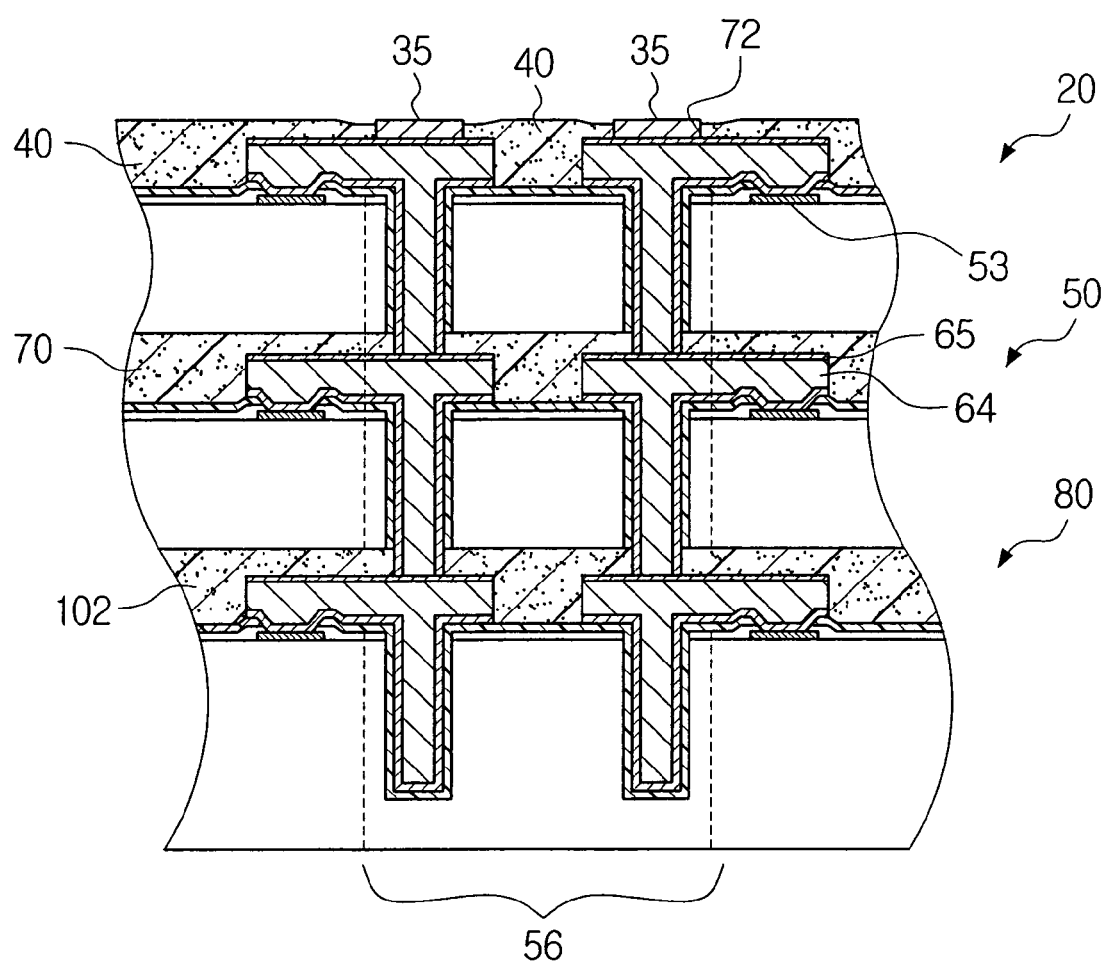

Referring to FIG. 19, the supporting board 87 and adhesive 85 are removed from the top surface of the first wafer 20 of the wafer stack including the stacked first, second and third wafers 20, 50, 80, for example using a thermal process or ultraviolet exposure. Next, as described in FIG. 7B, a conductive layer is applied and patterned to form connecting pads 35 for the chips of the first wafer 20. The conductive layer comprises, for example, a solder material applied using electroplating techniques, as described above. A photosensitive polymer layer 70 is then applied to an upper surface the second wafer 50 and patterned to expose the connecting pads 35.

Figure 20:
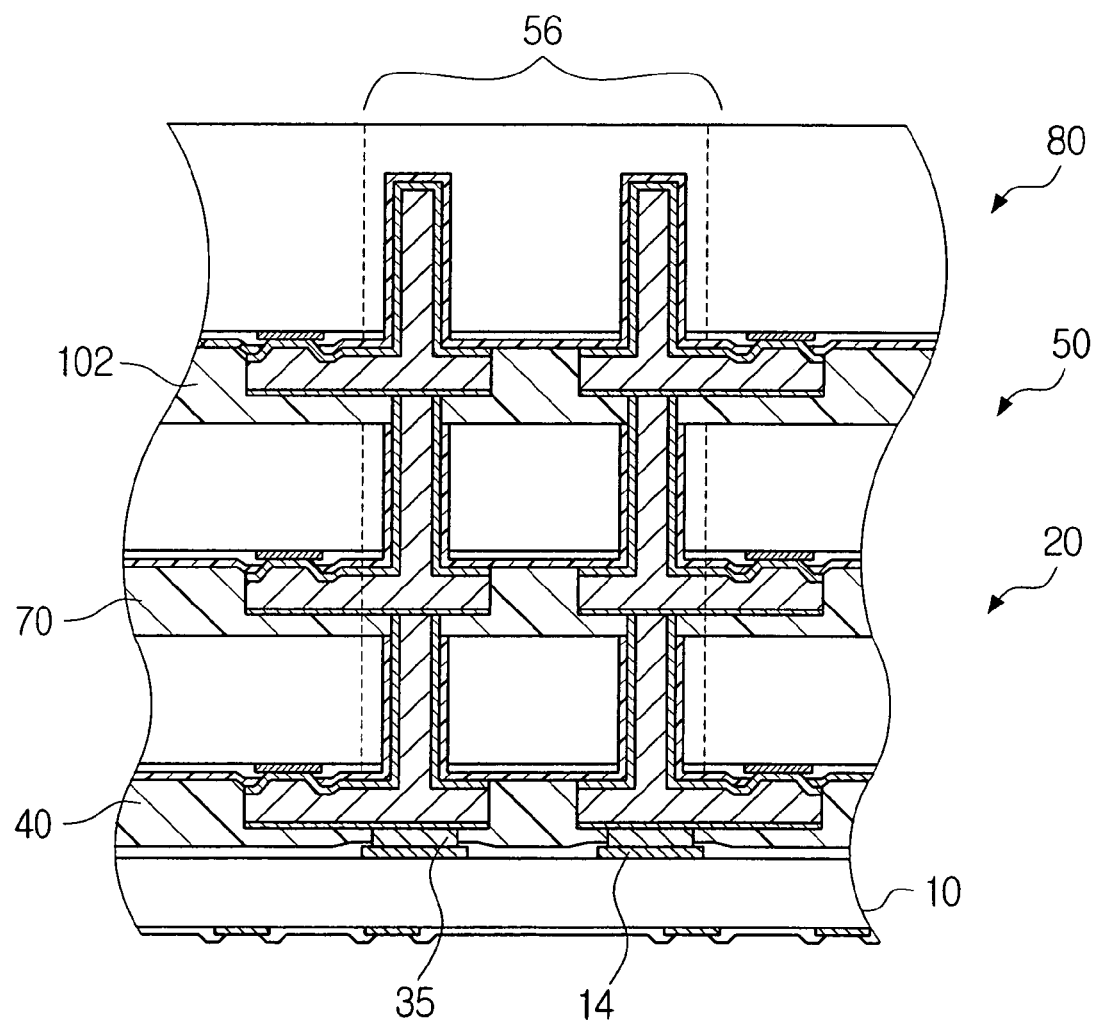

Referring to FIG. 20, the wafer stack, including the first, second and third wafers 20, 50, 80 are aligned and bonded so that a top surface of the first wafer 20 contacts a top surface of a printed circuit board 10. The printed circuit board 10 includes a plurality of chip bonding pads 14, that serve as interconnect locations for conductive paths on the printed circuit board 10. The connecting pads 35 of the chips of the first wafer 20 are aligned with the chip bonding pads 14 and bonded together. During stacking of the wafer stack on the printed circuit board 10, the photosensitive polymer layer 40 at a top surface of the first wafer 21 fills the gap between the first wafer 21 and the printed circuit board 10. A thermo-compression process is then performed to fully cure the photosensitive polymer layer 40 between the first wafer 20 and the printed circuit board 10.

Figure 21:
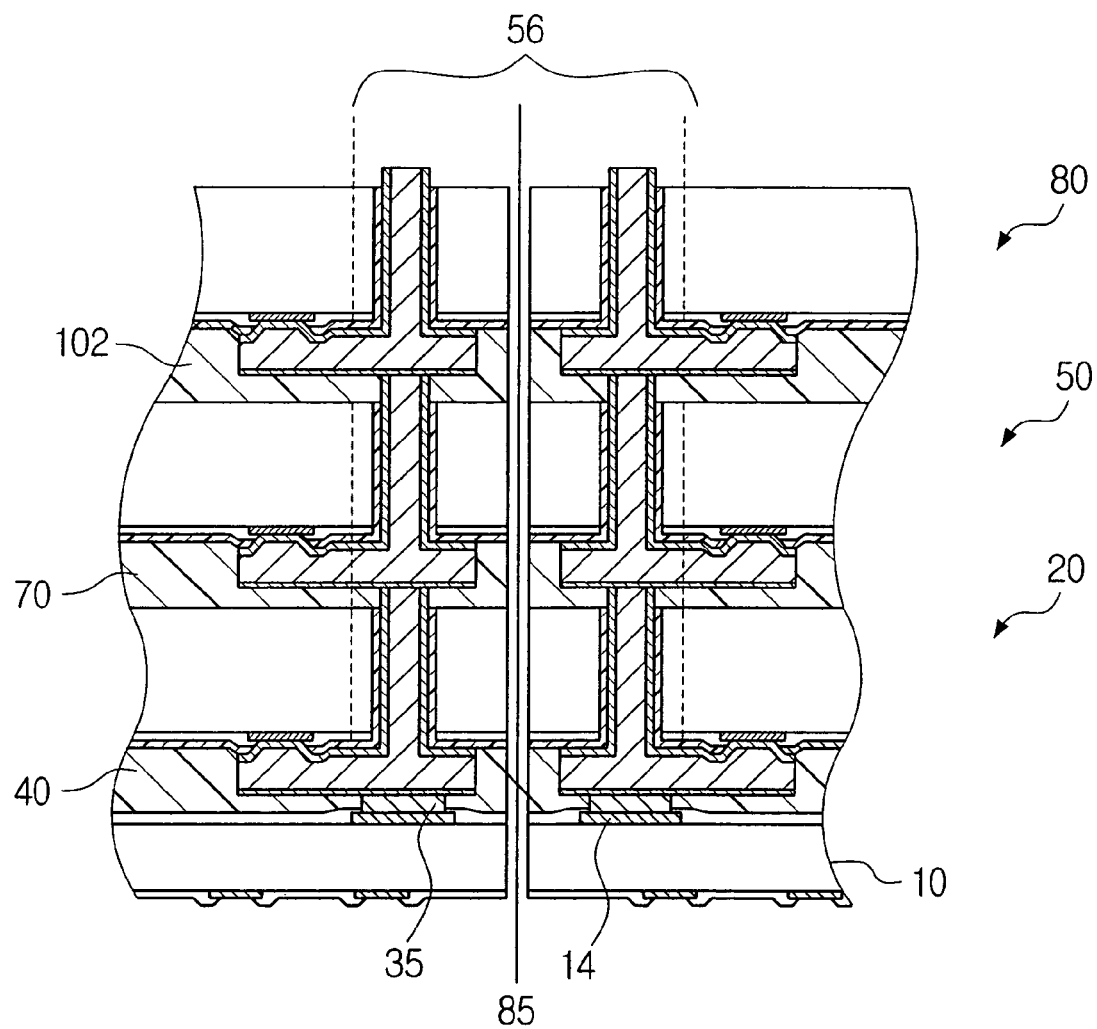

Referring to FIG. 21, the bottom surface of the third wafer 80 is thinned in an optional thinning process to remove excess substrate material, thereby decreasing the volume of the resulting wafer stack, and therefore reducing the form factor thereof. The extent of thinning depends on the application. Following thinning the wafer stack structure is diced 85 into multiple, independent chip stack structures, along scribe lane 56, according to conventional dicing techniques.

Figure 22:
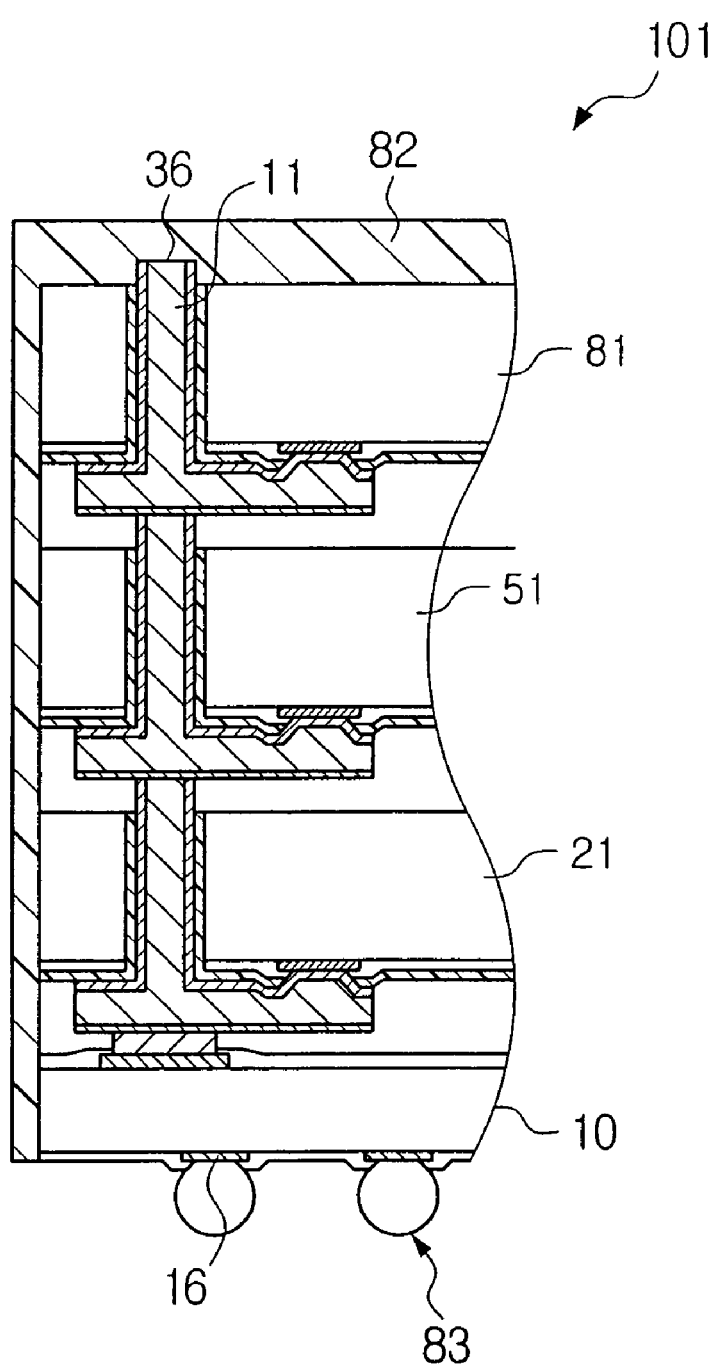

Referring to FIG. 22, an encapsulating material 82 is formed over and between the chip stacks 101, each including first, second and third chips 21, 51, 81 and a similarly diced portion of the printed circuit board 10 base. The encapsulating material comprises, for example, epoxy molding compound (EMC) or other suitable material. As described above, the uppermost third chip 81 of the chip stack 101 need not include vertical vias 11 or associated connecting bumps 36. Solder balls 83 may be applied to ball pads 16 at an underside of the printed circuit board 10. The printed circuit board 10 is then diced 85 along the encapsulation material 82 line between to form independent chip stack packages 100.

In this manner, the present invention provides for a stacked chip configuration, and manufacturing methods thereof, wherein the gap between a lower and an upper chip is filled completely using a relatively simple process that eliminates voids between-the lower and upper chips and the cracking and delamination problems associated with voids. The present invention is applicable to both chip-level bonding and wafer-level bonding approaches. A photosensitive polymer layer is applied to a first chip, or wafer, prior to stacking the chips or stacking the wafers. The photosensitive polymer layer is partially cured, so that the photosensitive polymer layer is made to be structurally stable, while retaining its adhesive properties. The second chip, or wafer, is stacked, aligned, and bonded to the first chip, or wafer, and the photosensitive polymer layer is then cured to fully bond the first and second chips, or wafers. In this manner, adhesion between chips/wafers is greatly improved, while providing complete gap fill. In addition, mechanical reliability is improved, alleviating the problems associated with cracking and delamination, and leading to an improvement in device yield and device reliability.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
  a first semiconductor device on a first substrate, the first semiconductor device including a first bonding pad on a first surface of the first substrate in a device region of the first semiconductor device;
  a first interconnect on the first surface of the first substrate, the first interconnect electrically coupled to the first bonding pad,
  a conductive via through the first substrate, the conductive via being electrically coupled to the first interconnect, a portion of the conductive via extending from a second surface of the first substrate opposite the first surface;
  a second semiconductor device on a second substrate, the second semiconductor device including a second bonding pad on a first surface of the second substrate in a device region of the second semiconductor device, the second substrate separated from the first substrate by a space between the first surface of the second substrate and the second surface of the first substrate;
  a second interconnect on the first surface of the second substrate, the second interconnect electrically coupled to the second bonding pad; and
  a photosensitive polymer layer filling the space between the first surface of the second substrate and the second surface of the first substrate, and bonding the first and second substrates to each other, the portion of the conductive via extending from the second surface of the first substrate further extending through the photosensitive polymer layer and contacting the second interconnect to electrically couple the first bonding pad to the second bonding pad.

2. The device of claim 1 wherein the photosensitive polymer layer is patterned to expose a portion of the second interconnect to enable contact with the conductive via.

3. The device of claim 1 wherein the first interconnect extends across the first surface of the first substrate in a direction toward an outer edge of the first substrate and wherein the second interconnect extends across the first surface of the second substrate in a direction toward an outer edge of the second substrate.

4. The device of claim 1 wherein the conductive via is positioned in a scribe lane region of the first semiconductor device.

5. The device of claim 1 wherein the conductive via is positioned in a device region of the first semiconductor device.

6. The device of claim 1 further comprising a conductive layer on an upper surface of the second interconnect.

7. The device of claim 1 wherein a distal end and a portion of distal sidewalls of the conductive via extend beyond the second surface of the first substrate.

8. The device of claim 1 wherein the first semiconductor device on the first substrate and the second semiconductor device on the second substrate are formed on a common semiconductor wafer.

9. The device of claim 1 wherein the first semiconductor device on the first substrate and the second semiconductor device on the second substrate are formed on separate first and second semiconductor wafers.

10. The device of claim 1 wherein the photosensitive polymer layer comprises a first photosensitive polymer layer and further comprising:
  a third substrate including a third bonding pad on a first surface of the third substrate; and
  a second photosensitive polymer layer between the first surface of the third substrate and the first surface of the first substrate that bonds the first and third substrates, the third bonding pad and the first interconnect being electrically coupled to each other through the second photosensitive polymer layer.

11. The device of claim 1 wherein the third substrate comprises a substrate selected from the group consisting of: printed circuit board (PCB), semiconductor device substrate, and package interposer.

12. The device of claim 1 wherein the photosensitive polymer layer is a material selected from the group consisting of: polymide, poly-benz-oxazole (PBO), benzo-cyclo-butene (BCB), epoxy, novolak, melamine-phenol, acrylate, and elastomer.

13. The device of claim 1 wherein the photosensitive polymer layer includes a photo active component and a bonding agent.

* * * * *